US010008502B2

(12) United States Patent
Endo

(10) Patent No.: US 10,008,502 B2
(45) Date of Patent: Jun. 26, 2018

(54) MEMORY DEVICE

(71) Applicant: Semiconductor Energy Laboratory Co., Ltd., Atsugi-shi, Kanagawa-ken (JP)

(72) Inventor: Masami Endo, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days. days.

(21) Appl. No.: 15/497,752

(22) Filed: Apr. 26, 2017

(65) Prior Publication Data

US 2017/0323892 A1 Nov. 9, 2017

(30) Foreign Application Priority Data

May 4, 2016 (JP) .................................. 2016-092865

(51) Int. Cl.
*H01L 27/108* (2006.01)
*H01L 29/786* (2006.01)
*H01L 27/1156* (2017.01)

(52) U.S. Cl.
CPC .... *H01L 27/10805* (2013.01); *H01L 27/1156* (2013.01); *H01L 29/7869* (2013.01); *H01L 27/108* (2013.01); *H01L 27/1085* (2013.01); *H01L 27/10847* (2013.01); *H01L 27/10855* (2013.01); *H01L 27/10867* (2013.01)

(58) Field of Classification Search
CPC ......... H01L 2921/1205; H01L 27/3265; H01L 2924/29041; H01L 23/5223; H01L 27/10811; H01L 27/10805; H01L 27/10814; H01L 27/10832; H01L 27/1085; H01L 27/10858; H01L 27/10847; H01L 27/10855; H01L 27/10867; H01L 27/10852
See application file for complete search history.

(56) References Cited

U.S. PATENT DOCUMENTS

| 4,466,081 A | 8/1984 | Masuoka |
| 4,609,986 A | 9/1986 | Hartmann et al. |
| 4,642,487 A | 2/1987 | Carter |
| 4,870,302 A | 9/1989 | Freeman |
| 4,902,637 A | 2/1990 | Kondou et al. |

(Continued)

FOREIGN PATENT DOCUMENTS

| JP | 2007-123861 | 5/2007 |
| JP | 2011-151383 | 8/2011 |
| JP | 2015-195074 | 11/2015 |

*Primary Examiner* — Thanh T Nguyen
(74) *Attorney, Agent, or Firm* — Fish & Richardson P.C.

(57) ABSTRACT

A memory device which stores a large amount of data is provided. The memory device includes a first transistor, a second transistor, a third transistor, a first capacitor, a second capacitor, and first to third wirings. The first transistor includes an oxide semiconductor in a channel formation region, the second transistor includes silicon in a channel formation region, and the third transistor includes silicon in a channel formation region. The first capacitor is provided in the same layer as the first transistor. A region of the second capacitor and a region of the first capacitor overlap with each other. The thickness of a dielectric of the second capacitor is preferably larger than the thickness of a dielectric of the first capacitor.

16 Claims, 24 Drawing Sheets

(56) References Cited

U.S. PATENT DOCUMENTS

| | | |
|---|---|---|
| 6,127,702 A | 10/2000 | Yamazaki et al. |
| 6,314,017 B1 | 11/2001 | Emori et al. |
| 6,781,865 B2 | 8/2004 | Ohtsuka et al. |
| 7,030,650 B1 | 4/2006 | Kaptanoglu et al. |
| 7,674,650 B2 | 3/2010 | Akimoto et al. |
| 7,732,819 B2 | 6/2010 | Akimoto et al. |
| 7,910,490 B2 | 3/2011 | Akimoto et al. |
| 7,932,521 B2 | 4/2011 | Akimoto et al. |
| 8,054,121 B2 | 11/2011 | Kato |
| 8,274,077 B2 | 9/2012 | Akimoto et al. |
| 8,314,637 B2 | 11/2012 | Kato et al. |
| 8,339,836 B2 | 12/2012 | Yamazaki et al. |
| 8,455,868 B2 | 6/2013 | Yamazaki et al. |
| 8,466,463 B2 | 6/2013 | Akimoto et al. |
| 8,629,069 B2 | 1/2014 | Akimoto et al. |
| 8,669,550 B2 | 3/2014 | Akimoto et al. |
| 8,790,959 B2 | 7/2014 | Akimoto et al. |
| 8,796,069 B2 | 8/2014 | Akimoto et al. |
| 9,099,562 B2 | 8/2015 | Akimoto et al. |
| 9,349,735 B2 | 5/2016 | Yamazaki et al. |
| 9,443,872 B2 | 9/2016 | Miyairi |
| 2002/0096702 A1 | 7/2002 | Ishii et al. |
| 2005/0237786 A1 | 10/2005 | Atwood et al. |
| 2007/0047286 A1 | 3/2007 | Miki |
| 2008/0280058 A1 | 11/2008 | Krunks et al. |
| 2008/0308805 A1 | 12/2008 | Akimoto et al. |
| 2009/0114918 A1 | 5/2009 | Wang et al. |
| 2010/0148171 A1 | 6/2010 | Hayashi et al. |
| 2011/0089417 A1 | 4/2011 | Yamazaki et al. |
| 2011/0101332 A1 | 5/2011 | Yamazaki et al. |
| 2011/0101351 A1 | 5/2011 | Yamazaki |
| 2011/0104851 A1 | 5/2011 | Akimoto et al. |
| 2011/0114945 A1 | 5/2011 | Yamazaki et al. |
| 2011/0121290 A1 | 5/2011 | Akimoto et al. |
| 2011/0121878 A1 | 5/2011 | Kato et al. |
| 2011/0122673 A1 | 5/2011 | Kamata et al. |
| 2011/0128777 A1 | 6/2011 | Yamazaki et al. |
| 2011/0134683 A1 | 6/2011 | Yamazaki et al. |
| 2011/0147737 A1 | 6/2011 | Yamazaki et al. |
| 2011/0156025 A1 | 6/2011 | Shionoiri et al. |
| 2011/0156027 A1 | 6/2011 | Yamazaki et al. |
| 2011/0156028 A1 | 6/2011 | Yamazaki et al. |
| 2011/0156117 A1 | 6/2011 | Yamazaki et al. |
| 2011/0157961 A1 | 6/2011 | Yamazaki et al. |
| 2011/0175083 A1 | 7/2011 | Sekine et al. |
| 2011/0175087 A1 | 7/2011 | Yamazaki et al. |
| 2011/0175104 A1 | 7/2011 | Yamazaki |
| 2011/0175646 A1 | 7/2011 | Takemura et al. |
| 2011/0176263 A1 | 7/2011 | Yamazaki et al. |
| 2011/0176348 A1 | 7/2011 | Yamazaki et al. |
| 2011/0176355 A1 | 7/2011 | Furutani et al. |
| 2011/0176377 A1 | 7/2011 | Koyama |
| 2011/0182110 A1 | 7/2011 | Yamazaki et al. |
| 2011/0186837 A1 | 8/2011 | Takahashi et al. |
| 2011/0187410 A1 | 8/2011 | Kato et al. |
| 2011/0194327 A1 | 8/2011 | Kawae |
| 2011/0194332 A1 | 8/2011 | Saito |
| 2012/0161220 A1 | 6/2012 | Yamazaki |
| 2012/0293200 A1 | 11/2012 | Takemura |
| 2012/0293201 A1 | 11/2012 | Fujita et al. |
| 2012/0293202 A1 | 11/2012 | Nishijima et al. |
| 2012/0293203 A1 | 11/2012 | Ohmaru et al. |
| 2012/0293206 A1 | 11/2012 | Yoneda et al. |
| 2012/0293242 A1 | 11/2012 | Kato |
| 2012/0306533 A1 | 12/2012 | Ohmaru |
| 2015/0263008 A1* | 9/2015 | Atsumi ............... G11C 7/1006 257/300 |
| 2015/0294710 A1* | 10/2015 | Onuki ............... G11C 7/1069 365/149 |
| 2015/0340513 A1 | 11/2015 | Akimoto et al. |
| 2016/0172009 A1* | 6/2016 | Matsuzaki ............ G11C 5/005 365/72 |
| 2016/0260718 A1 | 9/2016 | Yamazaki et al. |
| 2016/0380007 A1 | 12/2016 | Miyairi |

* cited by examiner

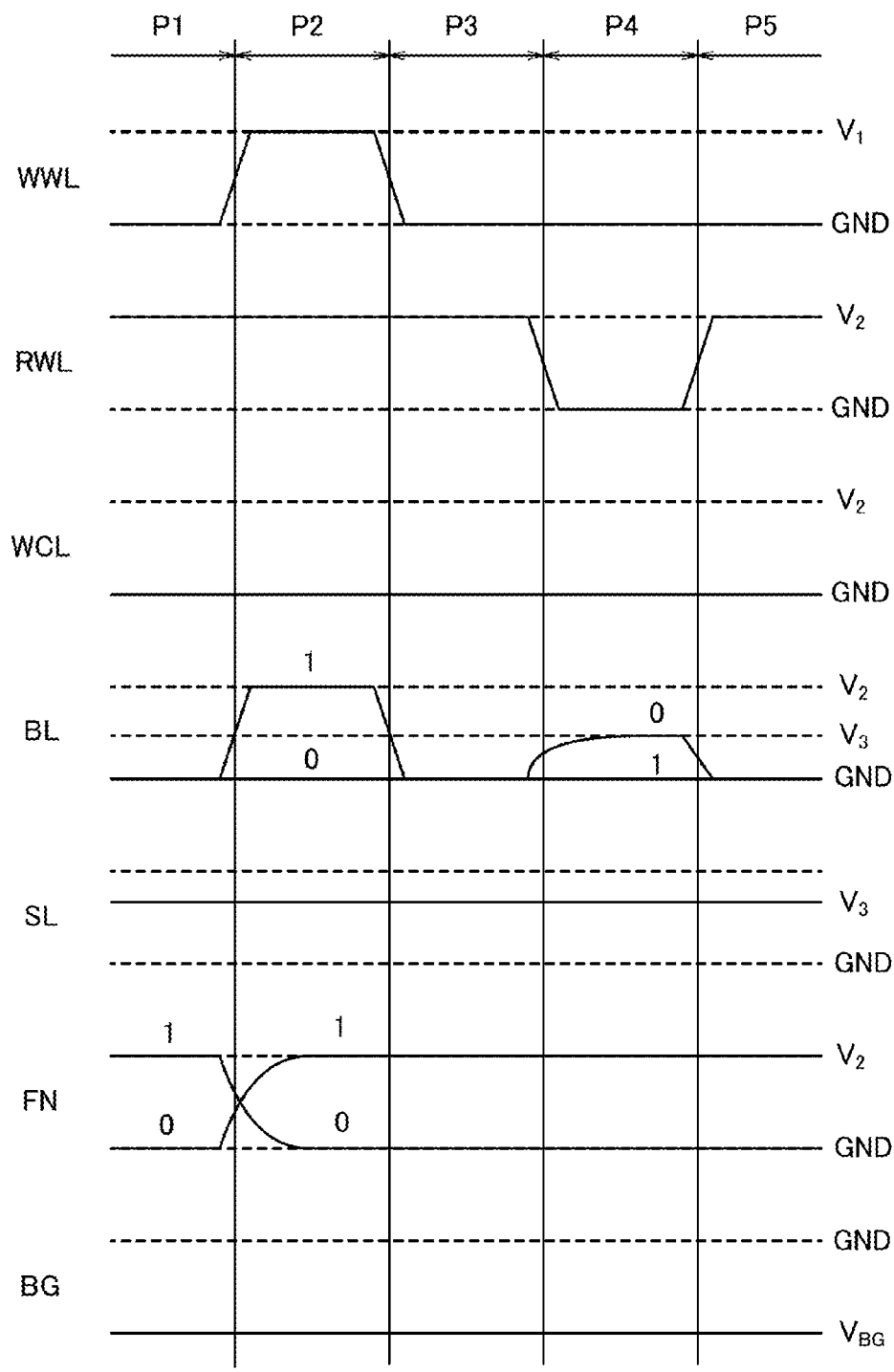

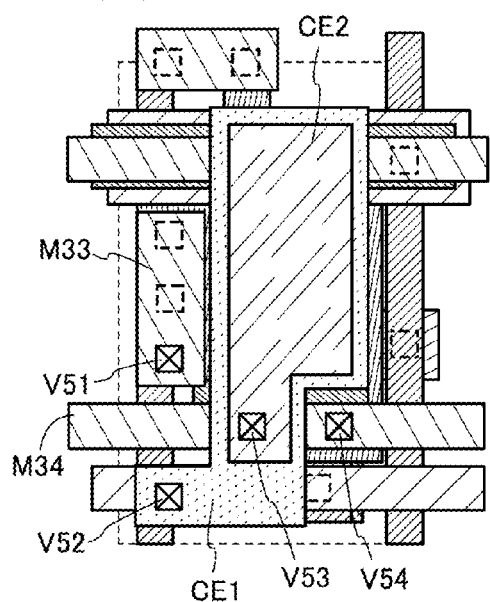
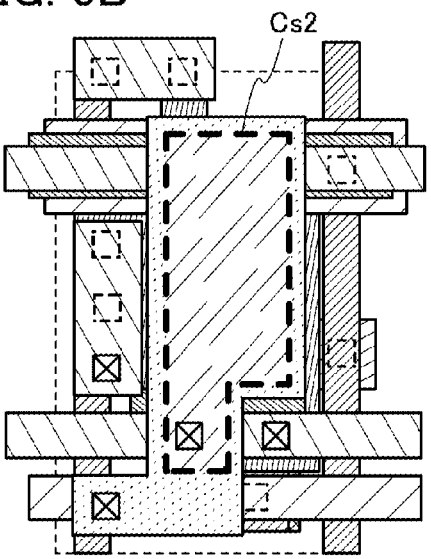
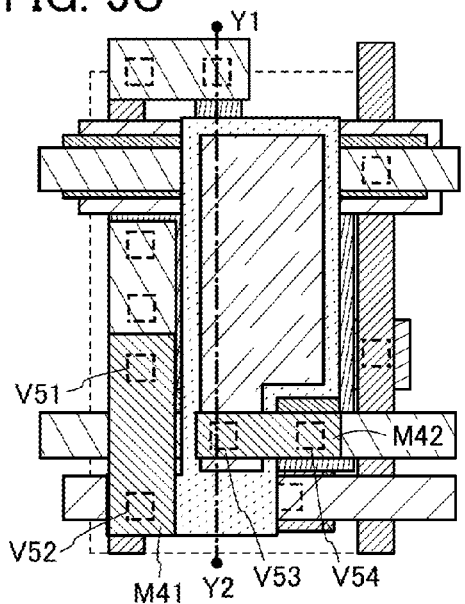

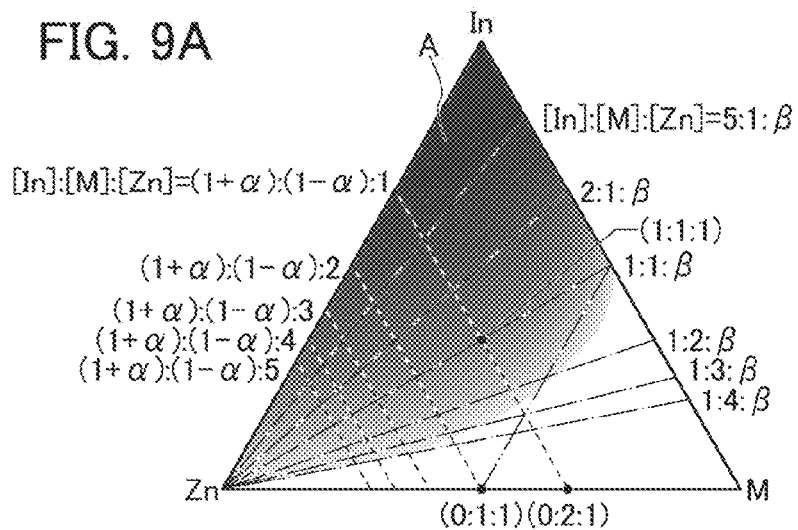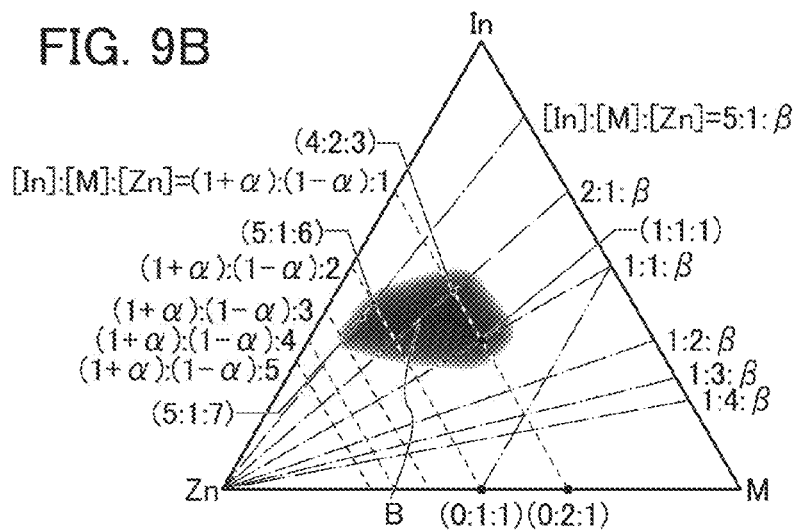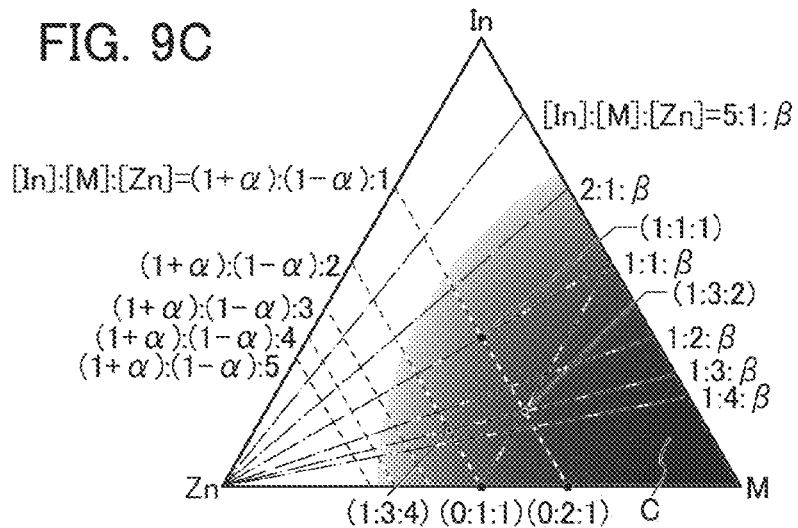

MEMORY DEVICE

BACKGROUND OF THE INVENTION

1. Field of the Invention

One embodiment of the present invention relates to a memory device.

Furthermore, one embodiment of the present invention relates to a semiconductor device. One embodiment of the present invention relates to a driving method of a semiconductor device or a manufacturing method of the semiconductor device. Moreover, one embodiment of the present invention relates to an object, a method, or a manufacturing method. One embodiment of the present invention relates to a process, a machine, manufacture, or a composition of matter.

In this specification and the like, a semiconductor device generally means a device that can function by utilizing semiconductor characteristics. A memory device, a display device, an electro-optical device, a power storage device, a semiconductor circuit, and an electronic device include a semiconductor device in some cases.

2. Description of the Related Art

Attention has been focused on a technique for forming a transistor using a semiconductor thin film (also referred to as a thin film transistor (TFT)) formed over a substrate having an insulating surface. Such a transistor is applied to a wide range of electronic devices such as an integrated circuit (IC) or an image display device (display device). A semiconductor material typified by silicon is widely known as a material for a semiconductor thin film that can be used for a transistor, and an oxide semiconductor has been attracting attention as well. For example, a technique for manufacturing a transistor using zinc oxide or an In—Ga—Zn oxide semiconductor is disclosed (see Patent Document 1).

Moreover, a transistor including an oxide semiconductor (oxide semiconductor transistor, also referred to as OS transistor below) has an extremely low off-state current. Nonvolatile memories that each utilize this low off-state current and include an OS transistor, a Si transistor, and a capacitor are disclosed in Patent Documents 2 and 3. These nonvolatile memories have unlimited cycling capability and consume low power.

Patent Document 2 discloses a nonvolatile memory in which an OS transistor and a capacitor are formed in the same layer. Patent Document 3 discloses a nonvolatile memory in which an OS transistor and a capacitor are formed in different layers.

REFERENCE

Patent Document

[Patent Document 1] Japanese Published Patent Application No. 2007-123861
[Patent Document 2] Japanese Published Patent Application No. 2011-151383
[Patent Document 3] Japanese Published Patent Application No. 2015-195074

SUMMARY OF THE INVENTION

In the case where a capacitor and an OS transistor are formed in the same layer in a nonvolatile memory, because the OS transistor occupies a considerable area of a memory cell, an enough area cannot be assigned to the capacitor.

In the case where the capacitor is positioned in an upper layer of the OS transistor, the capacitor can be formed with a large area regardless of the OS transistor; however, a reduction in memory cell size for a higher integration of the memory cell makes the assignment of an enough area for the capacitor impossible.

An object of one embodiment of the present invention is to provide a highly integrated memory cell. An object of one embodiment of the present invention is to provide a memory device which stores a large amount of data. An object of one embodiment of the present invention is to provide a memory device with low power consumption. An object of one embodiment of the present invention is to provide a novel semiconductor device.

Note that the description of a plurality of objects does not mutually preclude the existence. One embodiment of the present invention does not necessarily achieve all of the objects described above. Objects other than those listed above are apparent from the description of the specification, drawings, claims, and the like and also such objects could be an object of one embodiment of the present invention.

One embodiment of the present invention is a memory device including a first transistor, a second transistor, a first capacitor, a second capacitor, a conductor, and a wiring. The conductor has a function of one of a source and a drain of the first transistor. The conductor has a function of a first electrode of the first capacitor. A second electrode of the first capacitor is electrically connected to the wiring. A first electrode of the second capacitor is electrically connected to the conductor. A second electrode of the second capacitor is electrically connected to the wiring. A gate of the second transistor is electrically connected to the conductor. The first transistor comprises an oxide semiconductor in a channel formation region. The second transistor comprises silicon in a channel formation region. A region of the second capacitor and a region of the first capacitor overlap with each other.

In the above-described embodiment, a thickness of a dielectric of the second capacitor is preferably larger than a thickness of a dielectric of the first capacitor.

One embodiment of the present invention is a memory device including a first transistor, a second transistor, a third transistor, a first capacitor, a second capacitor, a conductor, a first wiring, a second wiring, and a third wiring. The conductor has a function of one of a source and a drain of the first transistor. The conductor has a function of a first electrode of the first capacitor. A second electrode of the first capacitor is electrically connected to the first wiring. A first electrode of the second capacitor is electrically connected to the conductor. A second electrode of the second capacitor is electrically connected to the first wiring. A gate of the second transistor is electrically connected to the conductor. One of a source and a drain of the second transistor is electrically connected to the second wiring through the third transistor. The other of the source and the drain of the second transistor is electrically connected to the third wiring. The first transistor comprises an oxide semiconductor in a channel formation region. The second transistor comprises silicon in a channel formation region. The third transistor comprises silicon in a channel formation region. A region of the second capacitor and a region of the first capacitor overlap with each other.

In the above-described embodiment, a thickness of a dielectric of the second capacitor is preferably larger than a thickness of a dielectric of the first capacitor.

One embodiment of the present invention is a semiconductor wafer which includes a plurality of the memory devices described as any of the above-described embodiments, and a separation region.

One embodiment of the present invention is an electronic device which includes the memory device described as any of the above-described embodiments, and a battery.

With one embodiment of the present invention, a highly integrated memory cell can be provided. With one embodiment of the present invention, a memory device which stores a large amount of data can be provided. With one embodiment of the present invention, a memory device with low power consumption can be provided. With one embodiment of the present invention, a novel semiconductor device can be provided.

Note that the description of these effects does not disturb the existence of other effects. One embodiment of the present invention does not necessarily achieve all the effects described above. Other effects will be apparent from and can be derived from the description of the specification, the drawings, the claims, and the like.

BRIEF DESCRIPTION OF THE DRAWINGS

In the accompanying drawings:

FIG. 2 is a timing chart showing an operation example of a memory cell;

FIGS. 5A to 5C are top views illustrating a structure example of a memory cell;

FIGS. 9A to 9C illustrates an $InMZnO_4$ crystal;

DETAILED DESCRIPTION OF THE INVENTION

Figure 1A:
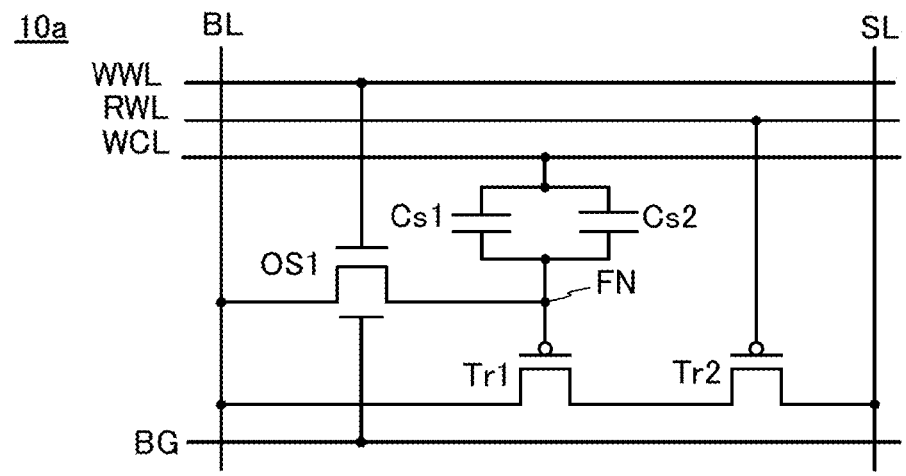
FIGS. 1A and 1B are circuit diagrams illustrating structure examples of a memory cell.

Hereinafter, embodiments will be described with reference to drawings. The embodiments can be implemented in various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. Note that the drawings are schematic views showing ideal examples, and embodiments of the present invention are not limited to shapes or values shown in the drawings.

Note that in this specification, a high power supply voltage and a low power supply voltage are sometimes referred to as an H level (or $V_{DD}$) and an L level (or GND), respectively.

Furthermore, in this specification, any of the embodiments and the examples described below can be combined as appropriate. In addition, in the case where a plurality of structure examples are described in one embodiment, some of the structure examples can be combined as appropriate.

Embodiment 1

In this embodiment, a memory cell of one embodiment of the present invention and a memory device using the memory cell are described.

<<Structure Example of Memory Cell>>
<Memory Cell 10a>

FIG. 1A is a circuit diagram illustrating a structure example of a memory cell 10a. The memory cell 10a includes a transistor OS1, a transistor Tr1, a transistor Tr2, a capacitor Cs1, and a capacitor Cs2. The memory cell 10a is electrically connected to a wiring BL, a wiring SL, a wiring WWL, a wiring RWL, a wiring WCL, and a wiring BG.

The transistor OS1 includes a first gate and a second gate. The transistor OS1 includes a region where the first gate and the second gate overlap with each other with a channel formation region provided therebetween. Note that the first gate may be referred to as a gate or a front gate, and the second gate may be referred to as a back gate.

The first gate of the transistor OS1 is electrically connected to the wiring WWL. The second gate of the transistor OS1 is electrically connected to the wiring BG. One of a source and a drain of the transistor OS1 is electrically connected to a gate of the transistor Tr1. The other of the source and the drain of the transistor OS1 is electrically connected to the wiring BL.

One of a source and a drain of the transistor Tr1 is electrically connected to the wiring SL through the transistor Tr2. The other of the source and the drain of the transistor Tr1 is electrically connected to the wiring BL.

A first electrode of the capacitor Cs1 is electrically connected to the gate of the transistor Tr1, and a second electrode of the capacitor Cs1 is electrically connected to the wiring WCL. A first electrode of the capacitor Cs2 is electrically connected to the gate of the transistor Tr1, and a second electrode of the capacitor Cs2 is electrically connected to the wiring WCL. The capacitor Cs1 and the capacitor Cs2 can be regarded as parallel-connected capacitors.

A node of the one of the source and the drain of the transistor OS1 and the gate of the transistor Tr1 is referred to as a node FN.

The wiring BL is a bit line, to which data to be stored in the memory cell 10a is supplied.

The wiring SL is a power supply line, to which a constant potential is supplied.

The wiring WWL is a word line, to which a H-level potential is supplied when data is written to the memory cell 10a.

The wiring RWL is a word line, to which a L-level potential is supplied when the data written to the memory cell 10a is read.

A constant potential (GND) is supplied to the wiring WCL.

The transistors Tr1 and Tr2 are preferably p-channel transistors. Furthermore, the transistors Tr1 and Tr2 are preferably transistors with high on-state currents. As the transistors with high on-state currents, transistors using silicon (Si) in their channel formation regions (Si transistors) are preferable, for example.

As the transistor OS1, it is preferable to use a transistor having a low current that flows between a source and a drain in a non-conducting state (low off-state current). Here, the term "low off-state current" means that a normalized off-state current per micrometer of channel width with a voltage between a source and a drain set at 1.8 V is $1 \times 10^{-20}$ A or lower at room temperature, $1 \times 10^{-18}$ A or lower at 85° C., or $1 \times 10^{-16}$ A or lower at 125° C. An example of a transistor with such a low off-state current is an OS transistor.

In the memory cell 10a, charges (data) are input to the node FN through the wiring BL and the transistor OS1. When the transistor OS1 is turned off after the charges are input to the node FN, the charges can be retained in the node FN of the memory cell 10a.

Because the transistor OS1 has a significantly low off-state current, the memory cell 10a can retain data for a long time. Furthermore, since data writing is possible only by turning on the transistor OS1, the memory cell 10a can perform data writing with lower power as compared with a flash memory which needs high voltage for writing, for example. In other words, a memory device using the memory cell 10a can have reduced power consumption.

<Memory Cell 10b>

Figure 1B:
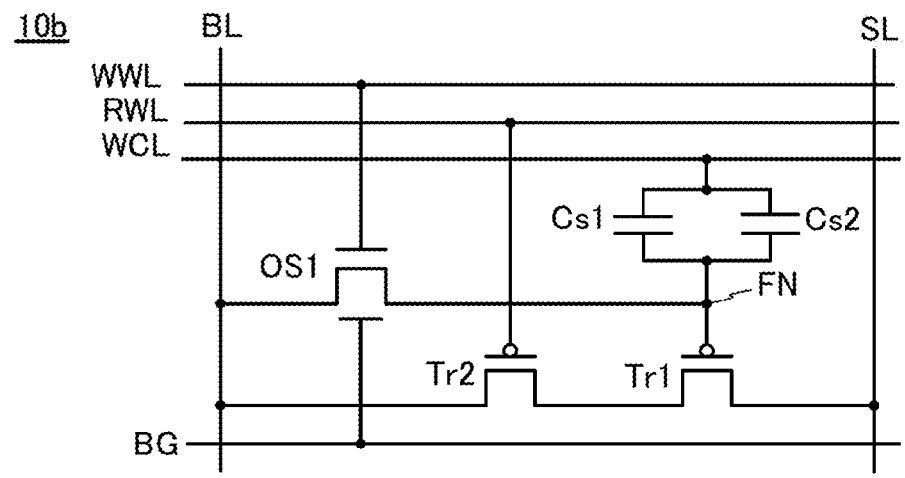

In the memory cell 10a, the transistor Tr2 can be provided between the other of the source and the drain of the transistor Tr1 and the wiring BL. A circuit diagram of such a case is illustrated in FIG. 1B. For the details of components of a memory cell 10b illustrated in FIG. 1B, the description of the memory cell 10a is referred to.

<<Operation Example of Memory Cell>>

Next, writing and reading operations of the memory cell 10a are described with reference to FIG. 2. The case where 1-bit data is retained in the node FN is described below. The following description can be applied to the memory cell 10b as it is.

FIG. 2 is a timing chart illustrating an operation example of the memory cell 10a. The timing chart shows the potentials applied to, from the top, the wiring WWL, the wiring RWL, the wiring WCL, the wiring BL, the wiring SL, the node FN, and the wiring BG. The timing chart in FIG. 2 is divided into periods P1 to P5.

The periods P1, P3, and P5 are standby periods of the memory cell 10a. The period P2 is a write period of the memory cell 10a. The period P4 is a read period of the memory cell 10a.

Note that in the periods P1 to P5, the wiring WCL is constantly supplied with GND. GND is preferably a low power supply potential or a ground potential.

Furthermore, in the periods P1 to P5, the wiring SL is constantly supplied with a potential $V_3$ and the wiring BG is constantly supplied with a potential $V_{BG}$. The potential $V_{BG}$ is preferably a negative potential. When the potential $V_{BG}$ that is a negative potential is supplied, the transistor OS1 can be normally off. Here, the term "normally off" means that a current per micrometer of channel width flowing in the transistor OS when the wiring WWL is supplied with the potential GND is $1 \times 10^{-20}$ A or lower at room temperature, $1 \times 10^{-18}$ A or lower at 85° C., or $1 \times 10^{-16}$ A or lower at 125° C.

Operations in the respective periods are described below in order.

<Period P1>

First, in the period P1, the wirings WWL and BL are supplied with GND and the wiring RWL is supplied with a potential $V_2$. At this time, the transistor Tr2 is off and no current flows between the wiring BL and the wiring SL. In order that the transistor Tr2 can be off, a difference between the potential $V_2$ and the potential $V_3$ ($V_2-V_3$) is preferably larger than the threshold voltage of the transistor Tr2.

<Period P2>

Then, in the period P2, the wiring WWL is supplied with a potential $V_1$ and the wiring BL is supplied with the potential $V_2$ (data "1") or GND (data "0"). The potential $V_1$ is preferably higher than the sum of the potential $V_2$ and the threshold voltage of the transistor OS1. At this time, the transistor OS1 is turned on and the data applied to the wiring BL is written to the node FN.

<Period P3>

Next, in the period P3, the wiring WWL and the wiring BL are supplied with GND. At this time, the transistor OS1 is turned off and the data written to the node FN is retained.

<Period P4>

Next, in the period P4, the wiring BL is brought into an electrically floating state and the wiring RWL is supplied with the potential GND. At this time, the transistor Tr2 is turned on.

If the data "1" has been written to the node FN, the transistor Tr1 is off, so that no current flows between the wiring SL and the wiring BL and the wiring BL remains at GND. In order that the transistor Tr1 can be off, a difference between the potential $V_2$ and the potential $V_3$ ($V_2-V_3$) is preferably larger than the threshold voltage of the transistor Tr1.

If the data "0" has been written to the node FN, the transistor Tr1 is on, so that the wiring SL and the wiring BL are electrically connected and the wiring BL is charged until it has the potential $V_3$ (until the potential of the wiring BL becomes equal to that of the wiring SL). In order that the transistor Tr1 can be on, a difference between GND and the potential $V_3$ ($-V_3$) is preferably smaller than the threshold voltage of the transistor Tr1. In order that the transistor Tr2 can be on, a difference between GND and the potential $V_3$ ($-V_3$) is preferably smaller than the threshold voltage of the transistor Tr2.

In the period P4, the potential of the wiring BL is read to determine the data written to the node FN.

<Period P5>

Then, in the period P5, the wiring RWL is supplied with the potential $V_2$ and the wiring BL is supplied with GND, so that the data in the node FN is retained.

As described above, through the operations in the periods P1 to P5, data reading from and data writing to the memory cell 10a can be performed.

<<Top View of Memory Cell>>

Next, top views of the memory cell 10a are described with reference to FIGS. 3A to 3D, FIGS. 4A to 4D, and FIGS. 5A to 5C.

Figure 3A:
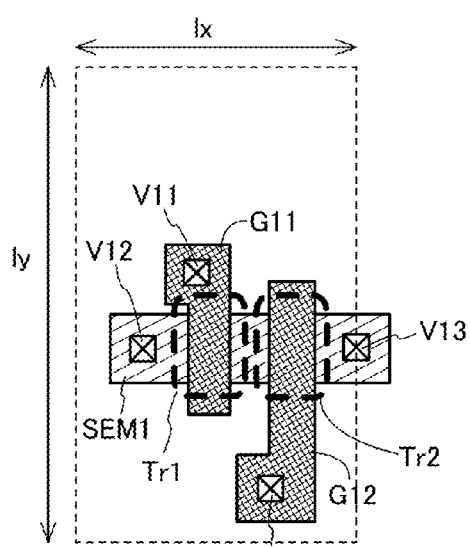
FIGS. 3A to 3D are top views illustrating a structure example of a memory cell.

The top views of the memory cell 10a are described from the lower layer in order. FIG. 3A is a top view of the transistor Tr1 and the transistor Tr2 formed over a substrate. In FIG. 3A, a semiconductor SEM1 has a function of active layer regions of the transistors Tr1 and Tr2, a conductor G11 has a function of a gate electrode of the transistor Tr1, and a conductor G12 has a function of a gate electrode of the transistor Tr2.

In FIG. 3A, lx represents the length in x direction (horizontal direction) of the memory cell 10a, and ly represents the length in y direction (vertical direction) of the memory cell 10a. The product of lx and ly represents the area of the memory cell 10a.

Figure 3B:
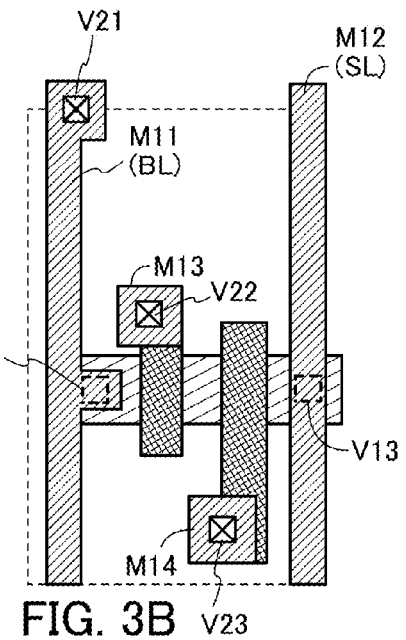

FIG. 3B is a top view illustrating a conductor M11, a conductor M12, a conductor M13, and a conductor M14 which are provided over the components illustrated in the top view of FIG. 3A. The conductor M11 has a function of the wiring BL, and the conductor M12 has a function of the wiring SL.

In FIGS. 3A and 3B, the conductor G11 and the conductor M13 are electrically connected to each other through a plug V11. The semiconductor SEM1 and the conductor M11 are electrically connected to each other through a plug V12. The semiconductor SEM1 and the conductor M12 are electrically connected to each other through a plug V13. The conductor G12 and the conductor M14 are electrically connected to each other through a plug V14.

Figure 3C:
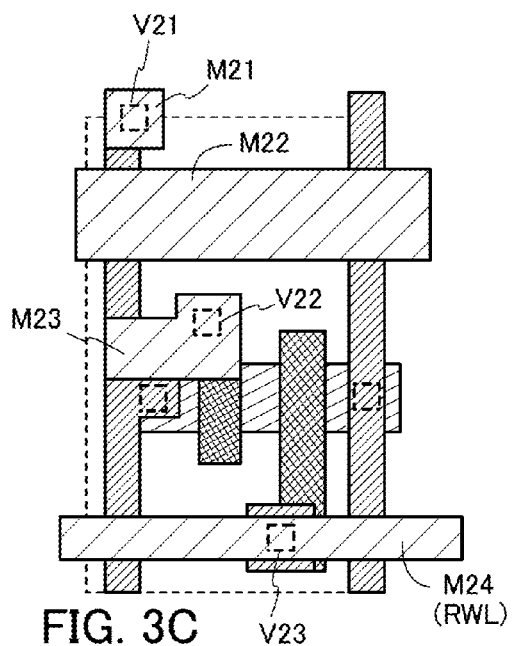

FIG. 3C is a top view illustrating a conductor M21, a conductor M22, a conductor M23, and a conductor M24 which are provided over the components illustrated in the top view of FIG. 3B. The conductor M24 has a function of the wiring RWL.

In FIGS. 3B and 3C, the conductor M11 and the conductor M21 are electrically connected to each other through a plug V21. The conductor M13 and the conductor M23 are electrically connected to each other through a plug V22. The conductor M14 and the conductor M24 are electrically connected to each other through a plug V23.

Figure 3D:
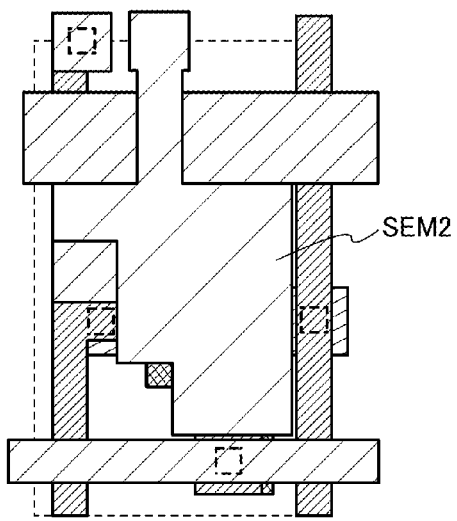

FIG. 3D is a top view illustrating a semiconductor SEM2 which is provided over the components illustrated in the top view of FIG. 3C. The semiconductor SEM2 has a function of a semiconductor region of the transistor OS1.

Figure 4A:
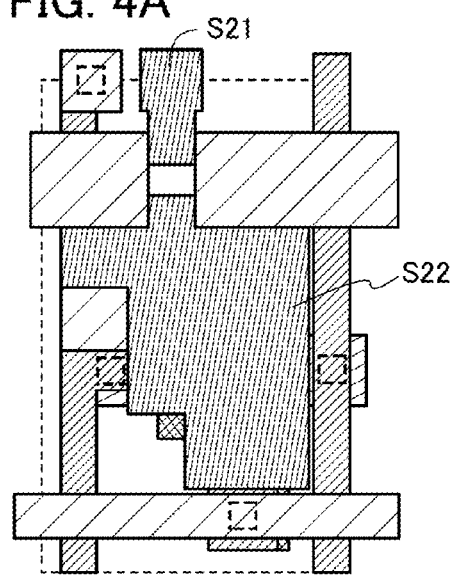
FIGS. 4A to 4D are top views illustrating a structure example of a memory cell.

FIG. 4A is a top view illustrating a conductor S21 and a conductor S22 which are provided over the components illustrated in the top view of FIG. 3D. The conductor S22 has a function of one of the source and the drain of the transistor OS1, and the conductor S21 has a function of the other of the source and the drain of the transistor OS1.

Figure 4B:
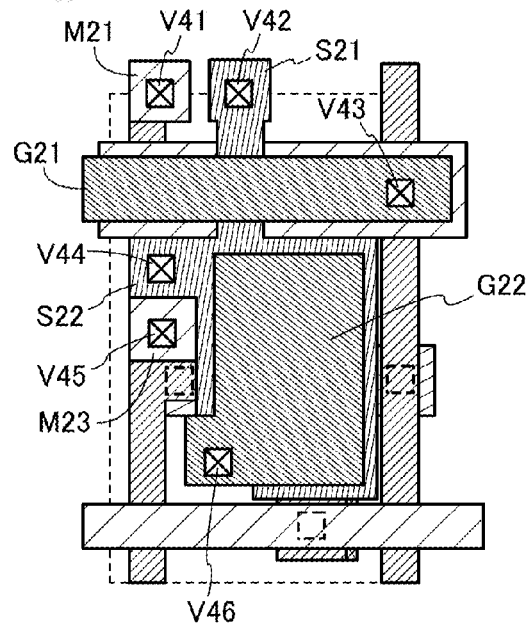

FIG. 4B is a top view illustrating a conductor G21 and a conductor G22 which are provided over the components illustrated in the top view of FIG. 4A. The conductor G21 has a function of the gate of the transistor OS1.

Figure 4C:
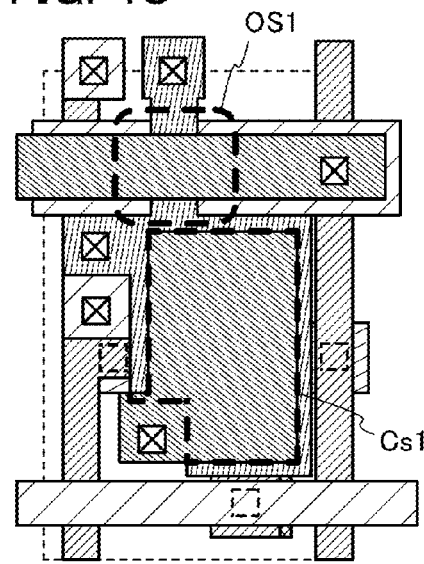

In FIG. 4C, the positions of the transistor OS1 and the capacitor Cs1 in the top view of FIG. 4B are indicated by thick broken lines.

Figure 4D:
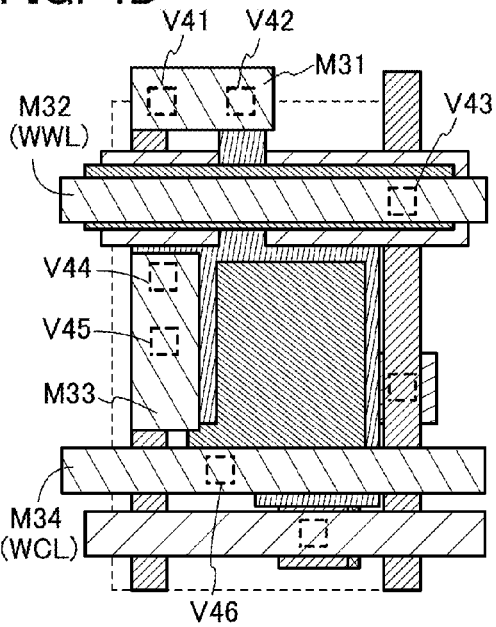

FIG. 4D is a top view illustrating a conductor M31, a conductor M32, a conductor M33, and a conductor M34 which are provided over the components illustrated in the top view of FIG. 4B. The conductor M32 has a function of the wiring WWL, and the conductor M34 has a function of the wiring WCL.

In FIGS. 4B and 4D, the conductor M21 and the conductor M31 are electrically connected to each other through a plug V41. The conductor S21 and the conductor M31 are electrically connected to each other through a plug V42. The conductor G21 and the conductor M32 are electrically connected to each other through a plug V43. The conductor S22 and the conductor M33 are electrically connected to each other through a plug V44. The conductor M23 and the conductor M33 are electrically connected to each other through a plug V45. The conductor G22 and the conductor M34 are electrically connected to each other through a plug V46.

FIG. 5A is a top view illustrating a conductor CE1 and a conductor CE2 which are provided over the components illustrated in the top view of FIG. 4D. The conductor CE1 has a function of a first electrode of the capacitor Cs2, and the conductor CE2 has a function of a second electrode of the capacitor Cs2.

In FIG. 5B, the position of the capacitor Cs2 in FIG. 5A is indicated by a thick broken line. The capacitor Cs2 preferably has a region overlapping with the capacitor Cs1, in which case the area of the memory cell 10a can be reduced while the storage capacity of the memory cell 10a is kept.

FIG. 5C is a top view illustrating a conductor M41 and a conductor M42 which are provided over the components illustrated in the top view of FIG. 5A.

In FIGS. 5A and 5C, the conductor M33 and the conductor M41 are electrically connected to each other through a plug V51. The conductor CE1 and the conductor M41 are electrically connected to each other through a plug V52. The conductor CE2 and the conductor M42 are electrically connected to each other through a plug V53. The conductor M34 and the conductor M42 are electrically connected to each other through a plug V54.

<<Cross-Sectional View of Memory Cell>>

Figure 6:
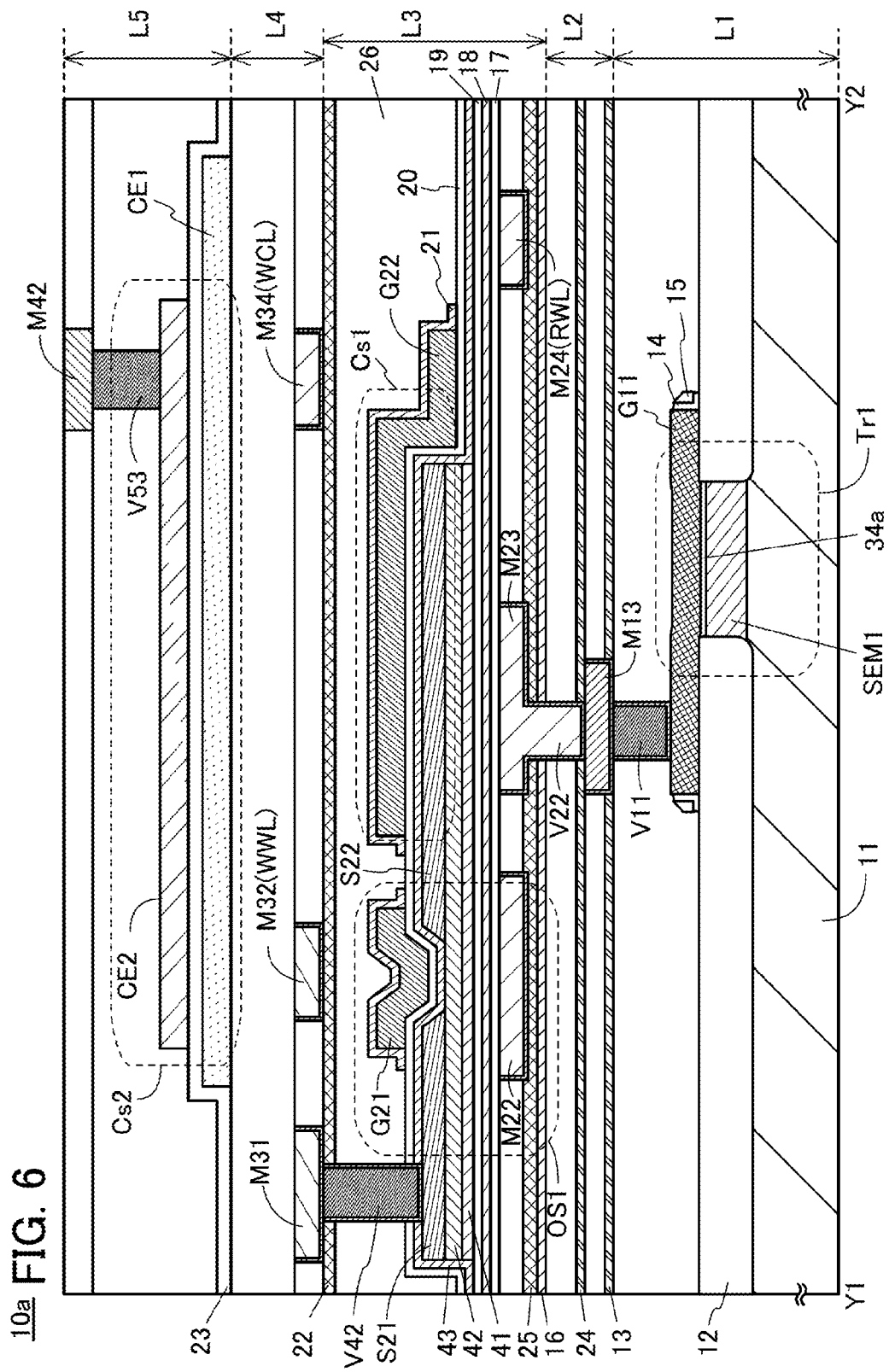
FIG. 6 is a cross-sectional view illustrating a structure example of a memory cell.

Next, a cross-sectional view of the memory cell 10a is described with reference to FIG. 6. FIG. 6 is a cross-sectional view taken along a dashed-dotted line Y1-Y2 in FIG. 5C.

The memory cell 10a illustrated in FIG. 6 includes, from the bottom, a layer L1, a layer L2, a layer L3, a layer L4, and a layer L5.

The layer L1 includes a substrate 11, an element separation layer 12, the semiconductor SEM1, an insulator 34a, the conductor G11, a sidewall insulating layer 14, a sidewall insulating layer 15, and the plug V11.

In the drawing, a portion functioning as the transistor Tr1 is indicated by a broken line. The transistor Tr1 is described in detail later.

The layer L2 includes an insulator 13, an insulator 24, the conductor M13, and the plug V22.

The layer L3 includes an insulator 16, an insulator 25, the conductor M22, the conductor M23, the conductor M24, an insulator 17, an insulator 18, an insulator 19, an oxide semiconductor 41, an oxide semiconductor 42, an oxide semiconductor 43, an insulator 20, an insulator 21, the conductor S21, the conductor S22, the conductor G21, the conductor G22, the plug V42, and an insulator 22. The conductor M24 has a function of the wiring RWL.

In the drawing, portions functioning as the transistor OS1 and the capacitor Cs1 are indicated by broken lines. The conductor G21 has a function of the gate of the transistor OS1. The conductor S22 has a function of one of the source and the drain of the transistor OS1, and the conductor S21 has a function of the other of the source and the drain of the transistor OS1. Furthermore, the conductor S22 has a function of the first electrode of the capacitor Cs1. The conductor G22 has a function of the second electrode of the capacitor Cs1. The insulator 20 has a function of a dielectric of the capacitor Cs1. The insulator 20 also has a function of the gate insulator of the transistor OS1. Note that the transistor OS1 is described in detail later.

The layer L4 includes the conductor M31, the conductor M32, and the conductor M34. The conductor M32 has a function of the wiring WWL, and the conductor M34 has a function of the wiring WCL.

The layer L5 includes the conductor CE1, an insulator 23, the conductor CE2, the plug V53, and the conductor M42. The conductor CE1 has a function of the first electrode of the capacitor Cs2, and the conductor CE2 has a function of the second electrode of the capacitor Cs2. The insulator 23 has a function of a dielectric of the capacitor Cs2. In the drawing, a portion functioning as the capacitor Cs2 is indicated by a broken line.

In the memory cell 10a, the capacitor Cs1 and the transistor OS1 are provided in the same layer. Therefore, in a manufacturing process of the memory cell 10a, the source and the drain of the transistor OS1 and the first electrode of the capacitor Cs1 are formed at the same time. Furthermore, the gate insulator of the transistor OS1 and the dielectric of the capacitor Cs1 are formed at the same time. Moreover, the gate of the transistor OS1 and the second electrode of the capacitor Cs1 are formed at the same time.

In the memory cell 10a, the capacitor Cs2 is provided over the capacitor Cs1. Furthermore, a region where the capacitor Cs1 and the capacitor Cs2 overlap with each other is included.

For example, in the case where the capacitor of the memory cell 10a is formed of only the capacitor Cs1, because the transistor OS1 occupies a considerable area of the memory cell 10a, an enough area cannot be assigned to the capacitor Cs1.

For example, in the case where the capacitor of the memory cell 10a is formed of only the capacitor Cs2, the capacitor Cs2 can be formed with a large area regardless of the transistor OS1; however, a reduction in the size of the memory cell 10a for a higher integration of the memory cell 10a makes the assignment of an enough area for the capacitor Cs2 impossible.

The structure illustrated in FIG. 6 is preferable because the capacitor Cs1 can make up a shortage in capacitance in the capacitor Cs2 even when the size of the memory cell 10a is small.

Furthermore, the thickness of the dielectric (the insulator 20) of the capacitor Cs1 is preferably smaller than that of the dielectric (the insulator 23) of the capacitor Cs2. Because the insulator 20 also serves as the gate insulator of the transistor OS1, an excessively large thickness of the insulator 20 disables the transistor OS1. Furthermore, because the area of the capacitor Cs2 is large, an excessively small thickness of the insulator 23 increases a leakage current through the insulator 23, which disables the capacitor Cs2 from retaining charges.

As the substrate 11, a single crystal semiconductor substrate or a polycrystalline semiconductor substrate of silicon or silicon carbide, a compound semiconductor substrate of silicon germanium, a silicon-on-insulator (SOI) substrate, or the like can be used. Alternatively, a glass substrate, a quartz substrate, a plastic substrate, a metal substrate, an attachment film, paper including a fibrous material, or a base film may be used as the substrate 11, for example. Alternatively, a semiconductor element may be formed using one substrate and then transferred to another substrate.

Alternatively, a flexible substrate may be used as the substrate 11. For the substrate 11 which is a flexible substrate, for example, metal, an alloy, resin, glass, or fiber thereof can be used. Examples of the resin include polyester, polyolefin, polyamide (e.g., nylon or aramid), polyimide, polycarbonate, acrylic, and polytetrafluoroethylene (PTFE). As a method for providing a transistor over a flexible substrate, there is a method in which the transistor is formed over a non-flexible substrate and then separated and transferred to the substrate 11 which is a flexible substrate. In that case, a separation layer is preferably provided between the non-flexible substrate and the transistor.

In the example illustrated in FIG. 6, a single crystal silicon wafer is used as the substrate 11.

The transistor Tr1 is provided on the substrate 11 and isolated from another adjacent transistor by the element isolation layer 12. For the element isolation layer 12, silicon oxide, silicon oxynitride, silicon nitride oxide, silicon nitride, or the like can be used. Note that in this specification, an oxynitride refers to a compound that contains more oxygen than nitrogen, and a nitride oxide refers to a compound that contains more nitrogen than oxygen.

The conductors M13, M31, M32, M34, CE1, CE2, and M42 and the plugs V11, V42, and V53 each preferably have a single-layer structure or a layered structure of a conductor containing a low-resistant material selected from copper, tungsten, molybdenum, gold, aluminum, manganese, titanium, tantalum, nickel, chromium, lead, tin, iron, cobalt, ruthenium, platinum, iridium, and strontium, an alloy of such a low-resistant material, or a compound containing such a material as its main component. It is particularly preferable to use a high-melting-point material that has both heat resistance and conductivity, such as tungsten or molybdenum. Alternatively, a low-resistant material such as aluminum or copper is preferably used.

In the case of using copper as the conductors or the plugs, an insulator that suppresses diffusion of copper is preferably used as the insulators 13 and 24. For example, silicon nitride can be used as an example of the insulator that suppresses diffusion of copper. Alternatively, a metal oxide such as aluminum oxide may be used.

For the details on the conductors M23 and M24 and the plug V22, later description of the conductor M22 is referred to.

When hydrogen from the substrate 11, the transistor Tr1, or the capacitor Cs2 enters the oxide semiconductors included in the transistor OS1, characteristics of the transistor OS1 might be lowered. Thus, it is preferable to use an insulator having barrier properties with respect to hydrogen as the insulator 16, the insulator 25, and the insulator 22. An example of the above-described insulator is silicon nitride deposited by a CVD method.

As an example of the insulator having barrier properties with respect to hydrogen, a metal oxide such as aluminum oxide, hafnium oxide, or tantalum oxide can be given. In particular, aluminum oxide has a high effect of blocking hydrogen. In addition, aluminum oxide also has a high effect of blocking oxygen. Thus, release of oxygen from the oxide semiconductors in the transistor OS1 can be suppressed.

A conductor having high barrier properties with respect to hydrogen is preferably provided on side surfaces and bottom surfaces of the conductors M22, M23, and M24 and the plug V22. As the conductor having high barrier properties with respect to hydrogen, tantalum nitride can be given, for example. The conductor having high barrier properties with respect to hydrogen can prevent hydrogen from entering the transistor OS1 through the conductors or plug.

The insulator 16 is preferably formed using an atomic layer deposition (ALD) method, for example. Accordingly, the insulator 16 can have favorable coverage, and formation of cracks, pin holes, and the like in the insulator 16 can be prevented. In addition, the insulator 25 is preferably formed using a sputtering method, for example. Accordingly, the insulator 25 can be formed at a higher deposition rate than the insulator 16 and can have a large thickness with higher productivity than the insulator 16. Such a stack of the insulators 16 and 25 can have higher barrier properties with respect to impurities such as hydrogen. Note that the insulator 25 may be provided under the insulator 16. Furthermore, when the insulator 16 has sufficient barrier properties with respect to impurities, the insulator 25 is not necessarily provided.

In FIG. 6, regions without reference numerals or hatch patterns represent regions formed of an insulator. As the insulator, an insulator containing at least one material selected from aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like can be used. Alternatively, in these regions, an organic resin such as a polyimide resin, a polyamide resin, an acrylic resin, a siloxane resin, an epoxy resin, or a phenol resin can be used.

<<Transistor Tr1, Transistor Tr2>>

Next, the transistor Tr1 and the transistor Tr2 are described in detail with reference to FIGS. 7A to 7C.

Figure 7A:
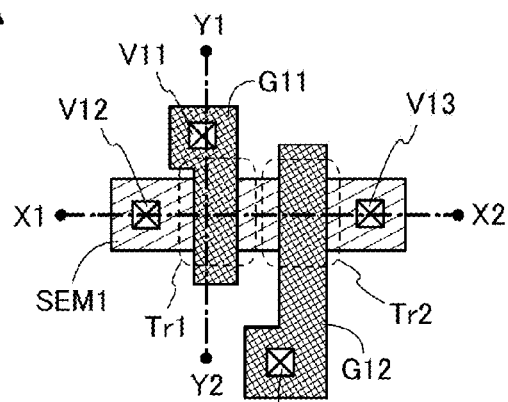
FIGS. 7A to 7C are a top view and cross-sectional views illustrating a structure example of transistors Tr1 and Tr2.

FIG. 7A is a top view of the transistor Tr1 and the transistor Tr2 (the same as the top view of FIG. 3A). FIG. 7B is a cross-sectional view taken along a dashed-dotted line X1-X2 in FIG. 7A, and FIG. 7C is a cross-sectional view taken along a dashed-dotted line Y1-Y2 in FIG. 7A. Note that the direction along the dashed-dotted line X1-X2 may be referred to as the channel length direction of the transistors Tr1 and Tr2, and the direction along the dashed-dotted line Y1-Y2 may be referred to as the channel width direction of the transistor Tr1.

Figure 7B:
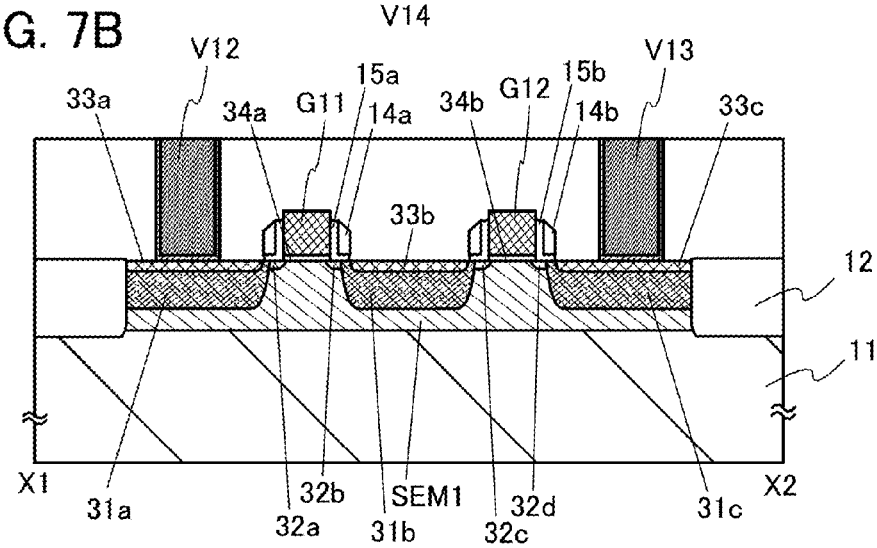

In FIG. 7B, the transistors Tr1 and Tr2 include low-concentration impurity regions 32a to 32d, high-concentration impurity regions 31a to 31c, conductive regions 33a to 33c provided in contact with the high-concentration impurity regions, the insulator 34a having a function of a gate insulator of the transistor Tr1, an insulator 34b having a function of a gate insulator of the transistor Tr2, the conductor G11 having a function of the gate electrode of the transistor Tr1, the conductor G12 having a function of the gate electrode of the transistor Tr2, sidewall insulating layers 14a and 15a provided on sidewalls of the conductor G11, and sidewall insulating layers 14b and 15b provided on sidewalls of the conductor G12. Note that metal silicide or the like may be used as the conductive regions 33a to 33c.

For the details of the plugs V12 and V13, the description of the plug V11 is referred to.

<<Transistor OS1>>

Next, the transistor OS1 is described in detail with reference to FIGS. 8A to 8C.

Figure 8A:
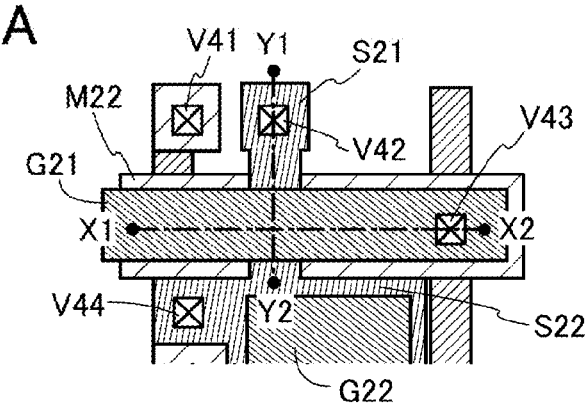
FIGS. 8A to 8C are a top view and cross-sectional views illustrating a structure example of a transistor OS1.

FIG. 8A is a top view illustrating part of the memory cell 10a in FIG. 4C, which is the transistor OS1 and its periphery. FIG. 8B is a cross-sectional view taken along a dashed-dotted line Y1-Y2 in FIG. 8A, and FIG. 8C is a cross-sectional view taken along a dashed-dotted line X1-X2 in FIG. 8A. Note that the direction along the dashed-dotted line Y1-Y2 may be referred to as the channel length direction of the transistor OS1, and the direction along the dashed-dotted line X1-X2 may be referred to as the channel width direction of the transistor OS1.

The transistor OS1 includes the conductor G21 functioning as the gate (first gate), the insulator 20 functioning as the gate insulator (first gate insulator), the conductor M22 (a conductor M22a and a conductor M22b) functioning as the second gate, the insulator 17, the insulator 18, and the insulator 19 functioning as a second gate insulator, an oxide semiconductor 40 (the oxide semiconductor 41, the oxide semiconductor 42, and the oxide semiconductor 43), the conductor S22 functioning as one of the source and the drain, the conductor S21 functioning as the other of the source and the drain, the insulator 21 which protects the conductor G21, and an insulator 26 which includes excess oxygen (oxygen in excess of the stoichiometric composition).

Figure 8B:
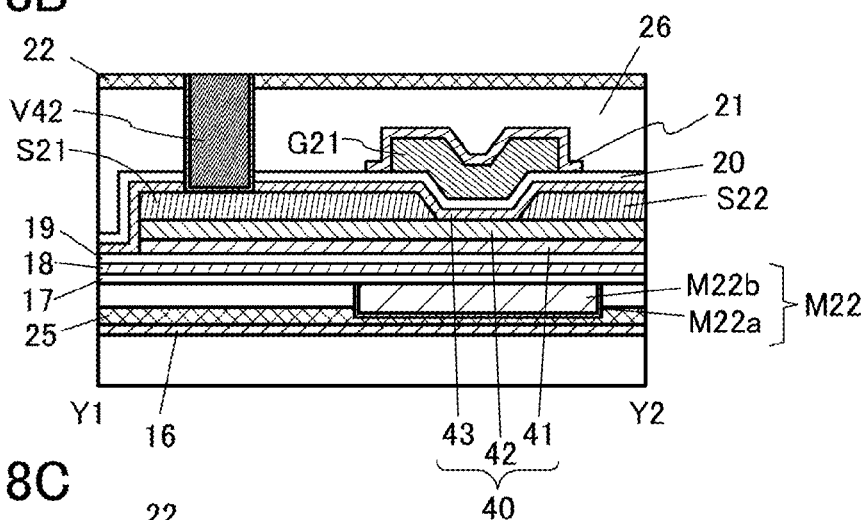
Figure 8C:
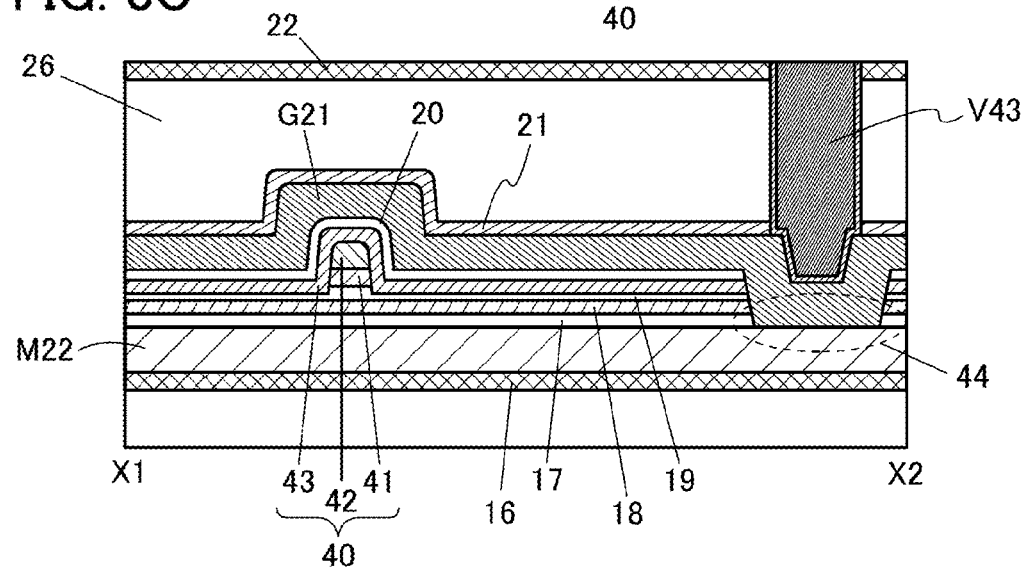

The conductor G21 and the conductor M22 are connected to each other through an opening 44 (FIG. 8C).

Furthermore, the oxide semiconductor 40 includes the oxide semiconductor 41, the oxide semiconductor 42 over the oxide semiconductor 41, and the oxide semiconductor 43 over the oxide semiconductor 42. When the transistor OS1 is turned on, a current flows mainly in the oxide semiconductor 42. That is, the oxide semiconductor 42 functions as a channel formation region. Meanwhile, although a current sometimes flows through a region in the vicinity of the interface (a mixed region in some cases) between the oxide semiconductor 42 and the oxide semiconductors 41 and 43, the other regions of the oxide semiconductors 41 and 43 sometimes function as insulators.

The oxide semiconductors 41 and 42 correspond to the semiconductor SEM2 in the top view of FIG. 3D.

<Oxide Semiconductor>

Next, an oxide semiconductor which can be used as the oxide semiconductor 40 is described.

An oxide semiconductor preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, and the like may be contained.

Here, the case where an oxide semiconductor is InMZnO containing indium, an element M, and zinc is considered. The element M is aluminum, gallium, yttrium, tin, or the like. Alternatively, the element M can be boron, silicon, titanium, iron, nickel, germanium, zirconium, molybdenum, lanthanum, cerium, neodymium, hafnium, tantalum, tungsten, magnesium, or the like. Note that two or more of the above elements may be used in combination as the element M, in some cases.

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

The CAAC-OS has c-axis alignment, its nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the nanocrystals are connected.

The shape of the nanocrystal is basically a hexagon but is not always a regular hexagon and is a non-regular hexagon in many cases. A pentagonal lattice arrangement, a heptagonal lattice arrangement, and the like are included in the distortion in some cases. Note that a clear grain boundary cannot be observed even in the vicinity of distortion in the CAAC-OS. That is, a lattice arrangement is distorted and thus formation of a grain boundary is inhibited. This is probably because the CAAC-OS can tolerate distortion owing to a low density of oxygen atom arrangement in an a-b plane direction, a change in interatomic bond distance by substitution of a metal element, and the like.

The CAAC-OS tends to have a layered crystal structure (also referred to as a stacked-layer structure) in which a layer containing indium and oxygen (hereinafter, In layer) and a layer containing the element M, zinc, and oxygen (hereinafter, (M, Zn) layer) are stacked. Note that indium and the element M can be replaced with each other, and when the element M of the (M, Zn) layer is replaced by indium, the layer can also be referred to as an (In, M, Zn) layer. When indium of the In layer is replaced by the element M, the layer can also be referred to as an (In, M) layer.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation of the whole film is not observed. Accordingly, in some cases, the nc-OS cannot be distinguished from an a-like OS or an amorphous oxide semiconductor, depending on an analysis method.

The a-like OS has a structure intermediate between those of the nc-OS and the amorphous oxide semiconductor. The a-like OS has a void or a low-density region. That is, the a-like OS has low crystallinity as compared with the nc-OS and the CAAC-OS.

Next, a preferred range of the atomic ratio of indium, the element M, and zinc contained in an oxide semiconductor will be described with reference to FIGS. 9A to 9C.

Note that the proportion of oxygen atoms is not shown in FIGS. 9A to 9C. The terms of the atomic ratio of indium, the element M, and zinc contained in the oxide semiconductor are denoted by [In], [M], and [Zn], respectively.

In FIGS. 9A to 9C, broken lines indicate a line where the atomic ratio [In]:[M]:[Zn] is $(1+\alpha):(1-\alpha):1$ ($-1\le\alpha\le1$), a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $5:1:\beta$ ($\beta\ge0$), a line where the atomic ratio [In]:[M]:[Zn] is $2:1:\beta$, a line where the atomic ratio [In]:[M]:[Zn] is $1:1:\beta$, a line where the atomic ratio [In]:[M]:[Zn] is $1:2:\beta$, a line where the atomic ratio [In]:[M]:[Zn] is $1:3:\beta$, and a line where the atomic ratio [In]:[M]:[Zn] is $1:4:\beta$.

A dashed double-dotted line indicates a line where the atomic ratio [In]:[M]:[Zn] is $(1+\gamma):2:(1-\gamma)$, where $-1\le\gamma\le1$. Furthermore, an oxide semiconductor with the atomic ratio of [In]:[M]:[Zn]=0:2:1 or a neighborhood thereof in FIGS. 9A to 9C tends to have a spinel crystal structure.

A plurality of phases (e.g., two phases or three phases) exist in the oxide semiconductor in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the oxide semiconductor, a grain boundary might be formed between different crystal structures.

A region A in FIG. 9A represents an example of the preferred range of the atomic ratio of indium, the element M, and zinc contained in an oxide semiconductor.

In addition, the oxide semiconductor having a higher content of indium can have higher carrier mobility (electron mobility). This is because in an oxide semiconductor containing indium, the element M, and zinc, the s orbital of heavy metal mainly contributes to carrier transfer, and when the indium content in the oxide semiconductor is increased, overlaps of the s orbitals of indium atoms are increased. Thus, an oxide semiconductor having a high content of indium has higher carrier mobility than an oxide semiconductor having a low content of indium.

In contrast, when the indium content and the zinc content in an oxide semiconductor become lower, carrier mobility becomes lower. Thus, with an atomic ratio of [In]:[M]:[Zn]=0:1:0 and the vicinity thereof (e.g., a region C in FIG. 9C), insulation performance becomes better.

Accordingly, an oxide semiconductor of one embodiment of the present invention preferably has an atomic ratio in the region A in FIG. 9A. With such an atomic ratio, a stacked-layer structure with high carrier mobility and a few grain boundaries is easily obtained.

An oxide semiconductor with an atomic ratio in the region A, particularly in a region B in FIG. 9B, is excellent because the oxide semiconductor easily becomes a CAAC-OS and has high carrier mobility.

The CAAC-OS is an oxide semiconductor with high crystallinity. In contrast, in the CAAC-OS, a reduction in electron mobility due to the grain boundary is less likely to occur because a clear grain boundary cannot be observed. Entry of impurities, formation of defects, or the like might decrease the crystallinity of an oxide semiconductor. This means that the CAAC-OS has small amounts of impurities and defects (e.g., oxygen vacancies). Thus, an oxide semiconductor including a CAAC-OS is physically stable. Therefore, the oxide semiconductor including a CAAC-OS is resistant to heat and has high reliability.

Note that the region B includes an atomic ratio of [In]:[M]:[Zn]=4:2:3 to 4:2:4.1 and the vicinity thereof. The vicinity includes an atomic ratio of [In]:[M]:[Zn]=5:3:4. Note that the region B includes an atomic ratio of [In]:[M]:[Zn]=5:1:6 and the vicinity thereof and an atomic ratio of [In]:[M]:[Zn]=5:1:7 and the vicinity thereof.

Note that the property of an oxide semiconductor is not uniquely determined by an atomic ratio. Even with the same atomic ratio, the property of an oxide semiconductor might be different depending on a formation condition. For example, in the case where the oxide semiconductor is deposited with a sputtering apparatus, a film having an atomic ratio deviated from the atomic ratio of a target is formed. In particular, [Zn] in the film might be smaller than [Zn] in the target depending on the substrate temperature in deposition. Thus, the illustrated regions each represent an atomic ratio with which an oxide semiconductor tends to have specific characteristics, and boundaries of the regions A to C are not clear.

The transistor OS1 illustrated in FIGS. 8B and 8C is further described here.

The energy level of the conduction band minimum of each of the oxide semiconductors 41 and 43 is closer to the vacuum level than that of the oxide semiconductor 42. Typically, a difference in the energy level between the conduction band minimum of the oxide semiconductor 42 and the conduction band minimum of each of the oxide semiconductors 41 and 43 is preferably greater than or equal to 0.15 eV or greater than or equal to 0.5 eV, and less than or equal to 2 eV or less than or equal to 1 eV. That is, a difference in the electron affinity between the oxide semiconductor 42 and each of the oxide semiconductors 41 and 43 is preferably greater than or equal to 0.15 eV or greater than or equal to 0.5 eV, and less than or equal to 2 eV or less than or equal to 1 eV.

The energy gap of the oxide semiconductor 42 is preferably 2 eV or more, further preferably 2.5 eV or more and 3.0 eV or less. The energy gap of each of the oxide semiconductors 41 and 43 is preferably 2 eV or more, further preferably 2.5 eV or more, still further preferably 2.7 eV or more and 3.5 eV or less. The energy gap of each of the oxide semiconductors 41 and 43 is preferably greater than that of the oxide semiconductor 42. For example, a difference in the energy gap between the oxide semiconductor 42 and the oxide semiconductors 41 and 43 is preferably 0.15 eV or more, 0.5 eV or more, 1.0 eV or more and 2 eV or less or 1 eV or less.

A decrease in the carrier density of an oxide semiconductor is preferable, in which case the negative shift of the threshold voltage of the transistor can be inhibited or the off-state current of the transistor can be reduced.

Examples of a factor affecting the carrier density of an oxide semiconductor include oxygen vacancies (Vo) and impurities in the oxide semiconductor. As the number of oxygen vacancies in the oxide semiconductor increases, the density of defect states increases when hydrogen is bonded to the oxygen vacancies (this state is also referred to as VoH). The density of defect states also increases with an increase in the amount of impurities in the oxide semiconductor. Hence, the carrier density of an oxide semiconductor can be controlled by controlling the density of defect states in the oxide semiconductor.

For example, the carrier density of each of the oxide semiconductors 41 and 43 is lower than $8 \times 10^{15}$ cm$^{-3}$, preferably lower than $1 \times 10^{11}$ cm$^{-3}$, further preferably lower than $1 \times 10^{10}$ cm$^{-3}$ and higher than or equal to $1 \times 10^{-9}$ cm$^{-3}$.

In contrast, the carrier density of an oxide semiconductor is preferably increased in order to improve the on-state current or field-effect mobility of a transistor. In order to increase the carrier density of the oxide semiconductor, the impurity concentration or the density of defect states in the oxide semiconductor is slightly increased, or alternatively, the bandgap of the oxide semiconductor is narrowed.

The carrier density of the oxide semiconductor 42 is preferably higher than those of the oxide semiconductor 41 and the oxide semiconductor 43. The carrier density of the oxide semiconductor 42 is preferably higher than or equal to $1 \times 10^5$ cm$^{-3}$ and lower than $1 \times 10^{18}$ cm$^{-3}$, further preferably higher than or equal to $1 \times 10^7$ cm$^{-3}$ and lower than or equal to $1 \times 10^{17}$ cm$^{-3}$, still further preferably higher than or equal to $1 \times 10^9$ cm$^{-3}$ and lower than or equal to $5 \times 10^{16}$ cm$^{-3}$, yet further preferably higher than or equal to $1 \times 10^{10}$ cm$^{-3}$ and lower than or equal to $1 \times 10^{16}$ cm$^{-3}$, and yet still preferably higher than or equal to $1 \times 10^{11}$ cm$^{-3}$ and lower than or equal to $1 \times 10^{15}$ cm$^{-3}$.

The density of defect states in a mixed layer formed at an interface between the oxide semiconductors 41 and 42 or an interface between the oxide semiconductors 42 and 43 is preferably made low.

Specifically, when the oxide semiconductors 41 and 42 or the oxide semiconductors 42 and 43 contain the same element (as a main component) in addition to oxygen, a mixed layer with a low density of defect states can be formed. For example, in the case where the oxide semiconductor 42 is an In—Ga—Zn oxide semiconductor, it is preferable to use an In—Ga—Zn oxide semiconductor, a Ga—Zn oxide semiconductor, gallium oxide, or the like as each of the oxide semiconductors 41 and 43.

At this time, the oxide semiconductor 42 serves as a main carrier path. Since the density of defect states at the interface between the oxide semiconductors 41 and 42 and the interface between the oxide semiconductors 42 and 43 can be made low, the influence of interface scattering on carrier conduction is small, and a high on-state current can be obtained.

When an electron is trapped in a trap state, the trapped electron behaves like fixed charge; thus, $V_{th}$ of the transistor is shifted in the positive direction. The oxide semiconductors 41 and 43 can make the trap state apart from the oxide semiconductor 42. This structure can prevent the positive shift of $V_{th}$ of the transistor.

A material whose conductivity is sufficiently lower than that of the oxide semiconductor 42 is used for the oxide semiconductors 41 and 43. In that case, the oxide semiconductor 42, the interface between the oxide semiconductors 41 and 42, and the interface between the oxide semiconductors 42 and 43 mainly function as a channel region. For example, an oxide semiconductor with high insulation performance and the atomic ratio in the region C in FIG. 9C can be used as the oxide semiconductors 41 and 43. Note that the region C in FIG. 9C shows the atomic ratio [In]:[M]:[Zn] of 0:1:0 or around 0:1:0.

In the case where an oxide semiconductor with the atomic ratio in the region A in FIG. 9A is used as the oxide semiconductor 42, it is particularly preferable to use an oxide semiconductor with [M]/[In] of greater than or equal to 1, preferably greater than or equal to 2, as each of the oxide semiconductors 41 and 43. In addition, it is suitable to use an oxide semiconductor with [M]/([Zn]+[In]) of greater than or equal to 1 and sufficiently high insulation performance as the oxide semiconductor 43.

The oxide semiconductor 42 preferably includes the above-described CAAC-OS.

The oxide semiconductor 43 preferably has lower crystallinity than the oxide semiconductor 42. The reduction in crystallinity of the oxide semiconductor 43 makes the oxide semiconductor 43 have a higher oxygen-transmitting property, leading to easy supply of oxygen from the insulator positioned above the oxide semiconductor 43 to the oxide semiconductor 42. Similarly, the oxide semiconductor 41 preferably has lower crystallinity than the oxide semiconductor 42. The reduction in crystallinity of the oxide semiconductor 41 makes the oxide semiconductor 41 have a higher oxygen-transmitting property, leading to easy supply of oxygen from the insulator positioned below the oxide semiconductor 41 to the oxide semiconductor 42. For example, the above-described nc-OS or a-like OS may be used as the oxide semiconductors 41 and 43.

Other Components

Next, other components of the transistor OS1 are described.

The conductor M22 is formed using a metal film containing an element selected from molybdenum, titanium, tantalum, tungsten, aluminum, copper, chromium, neodymium, and scandium; a metal nitride film containing any of the above elements as its component (e.g., a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

For example, it is preferable to use a conductor having barrier properties with respect to hydrogen (e.g., tantalum nitride) as the conductor M22a and stack tungsten, which has high conductivity, as the conductor M22b over the conductor M22a. The use of the combination of such materials can prevent diffusion of hydrogen into the oxide semiconductor 40 while conductivity of a wiring is ensured.

Each of the insulators 17 and 19 is preferably an insulator containing oxygen, such as a silicon oxide film or a silicon oxynitride film. In particular, the insulator 19 is preferably an insulator containing excess oxygen. When such an insulator containing excess oxygen is provided in contact with the oxide semiconductor in the transistor OS1, oxygen vacancies in the oxide semiconductor can be compensated. Note that the insulator 17 and the insulator 19 are not necessarily formed of the same material.

The insulator 18 preferably has a single-layer structure or a stacked-layer structure using an insulator such as silicon nitride, silicon nitride oxide, aluminum oxide, hafnium oxide, tantalum oxide, zirconium oxide, lead zirconate titanate (PZT), strontium titanate (SrTiO$_3$), or (Ba,Sr)TiO$_3$ (BST), for example. Aluminum oxide, bismuth oxide, germanium oxide, niobium oxide, silicon oxide, titanium oxide, tungsten oxide, yttrium oxide, or zirconium oxide may be added to the insulator, for example. The insulator may be subjected to nitriding treatment.

Note that the insulator 18 may have a stacked-layer structure of two or more layers. In this case, the stacked layers are not necessarily formed of the same material but may be formed of different materials.

Furthermore, $V_{th}$ can be controlled by appropriate adjustment of the thicknesses of the insulators 17 to 19. A transistor having a low leakage current in an off state can be provided. The insulators 17 to 19 are preferably thin for easy control of $V_{th}$ by the conductor M22. For example, each of the insulators 17 to 19 has a thickness of 50 nm or less, preferably 30 nm or less, further preferably 10 nm or less, furthermore preferably 5 nm or less.

The insulator 20 can have a single-layer structure or a stacked-layer structure using an insulator such as silicon oxide, silicon oxynitride, silicon nitride oxide, aluminum oxide, hafnium oxide, tantalum oxide, zirconium oxide, lead zirconate titanate (PZT), strontium titanate (SrTiO$_3$), or (Ba,Sr)TiO$_3$ (BST), for example. Aluminum oxide, bismuth oxide, germanium oxide, niobium oxide, silicon oxide, titanium oxide, tungsten oxide, yttrium oxide, or zirconium oxide may be added to the insulator, for example. The insulator may be subjected to nitriding treatment. A layer of silicon oxide, silicon oxynitride, or silicon nitride may be stacked over the insulator.

Like the insulator 19, the insulator 20 is preferably an oxide insulator that contains oxygen in excess of the stoichiometric composition. When such an insulator containing excess oxygen is provided in contact with the oxide semiconductor 40, oxygen vacancies in the oxide semiconductor 40 can be reduced.

As the insulator 20, it is possible to use an insulator having barrier properties with respect to oxygen and hydrogen, such as aluminum oxide, aluminum oxynitride, hafnium oxide, hafnium oxynitride, or silicon nitride. The insulator formed of such a material functions as a layer that prevents release of oxygen from the oxide semiconductor 40 or entry of impurities such as hydrogen from the outside.

A metal such as aluminum, titanium, chromium, nickel, copper, yttrium, zirconium, molybdenum, silver, tantalum, or tungsten or an alloy containing any of the metals as its main component can be used for the conductors S21 and S22. Although a single layer structure is shown, a stacked-layer structure of two or more layers may be employed.

For example, each of the conductors S21 and S22 can have a stacked-layer structure of titanium and aluminum. Other examples include a two-layer structure in which aluminum is stacked over tungsten, a two-layer structure in which copper is stacked over copper-magnesium-aluminum, a two-layer structure in which copper is stacked over titanium, and a two-layer structure in which copper is stacked over tungsten.

Further alternatively, for example, each of the conductors S21 and S22 can have a three-layer structure in which titanium or titanium nitride, aluminum or copper, and titanium or titanium nitride are stacked in this order; or a three-layer structure in which molybdenum or molybdenum nitride, aluminum or copper, and molybdenum or molybdenum nitride are stacked in this order. Note that a transparent conductive material containing indium oxide, tin oxide, or zinc oxide may be used.

The conductor G21 can be formed using, for example, a metal selected from aluminum, chromium, copper, tantalum, titanium, molybdenum, and tungsten, an alloy containing any of these metals as its component, or an alloy containing any of these metals in combination. Furthermore, one or both of manganese and zirconium may be used. Alternatively, a semiconductor typified by polycrystalline silicon doped with an impurity element such as phosphorus, or silicide such as nickel silicide may be used.

For example, the conductor G21 may have a two-layer structure in which titanium is stacked over aluminum. Other examples include a two-layer structure in which titanium is stacked over titanium nitride, a two-layer structure in which tungsten is stacked over titanium nitride, and a two-layer structure in which tungsten is stacked over tantalum nitride or tungsten nitride.

The conductor G21 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

By using a material with a high work function for the conductor G21, $V_{th}$ of the transistor OS1 can be increased and the cutoff current can be lowered. A conductive material whose work function is preferably 4.8 eV or more, further preferably 5.0 eV or more, still further preferably 5.2 eV or more, still further preferably 5.4 eV or more, yet still further preferably 5.6 eV or more is used for the conductor G21.

Examples of a conductive material with a high work function include molybdenum, molybdenum oxide, Pt, Pt silicide, Ni silicide, indium tin oxide, and In—Ga—Zn oxide to which nitrogen is added.

The insulator 21 is provided so as to cover the conductor G21. As the insulator 21, an insulator having barrier properties with respect to oxygen and hydrogen, such as aluminum oxide, aluminum oxynitride, hafnium oxide, hafnium oxynitride, or silicon nitride, can be used. Using any of these materials can prevent oxidation of the conductor G21 by heat treatment. Note that the insulator 21 can be omitted when a material that is hard to oxidize is used as the conductor G21.

The insulator 26 is provided over the transistor OS1. The insulator 26 preferably contains excess oxygen. In particular, when an insulator containing excess oxygen is provided as an interlayer film or the like in the vicinity of the transistor OS1, oxygen vacancies in the transistor OS1 are reduced, whereby the reliability can be improved.

As the insulator containing excess oxygen, specifically, an oxide material that releases part of oxygen by heating is preferably used. An oxide material that releases part of oxygen by heating is an oxide film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

As such a material, a material containing silicon oxide or silicon oxynitride is preferably used, for example. Note that in this specification, silicon oxynitride refers to a material that contains oxygen at a higher proportion than nitrogen, and silicon nitride oxide refers to a material that contains nitrogen at a higher proportion than oxygen.

<<Structure Example of Memory Device>>

Figure 10:
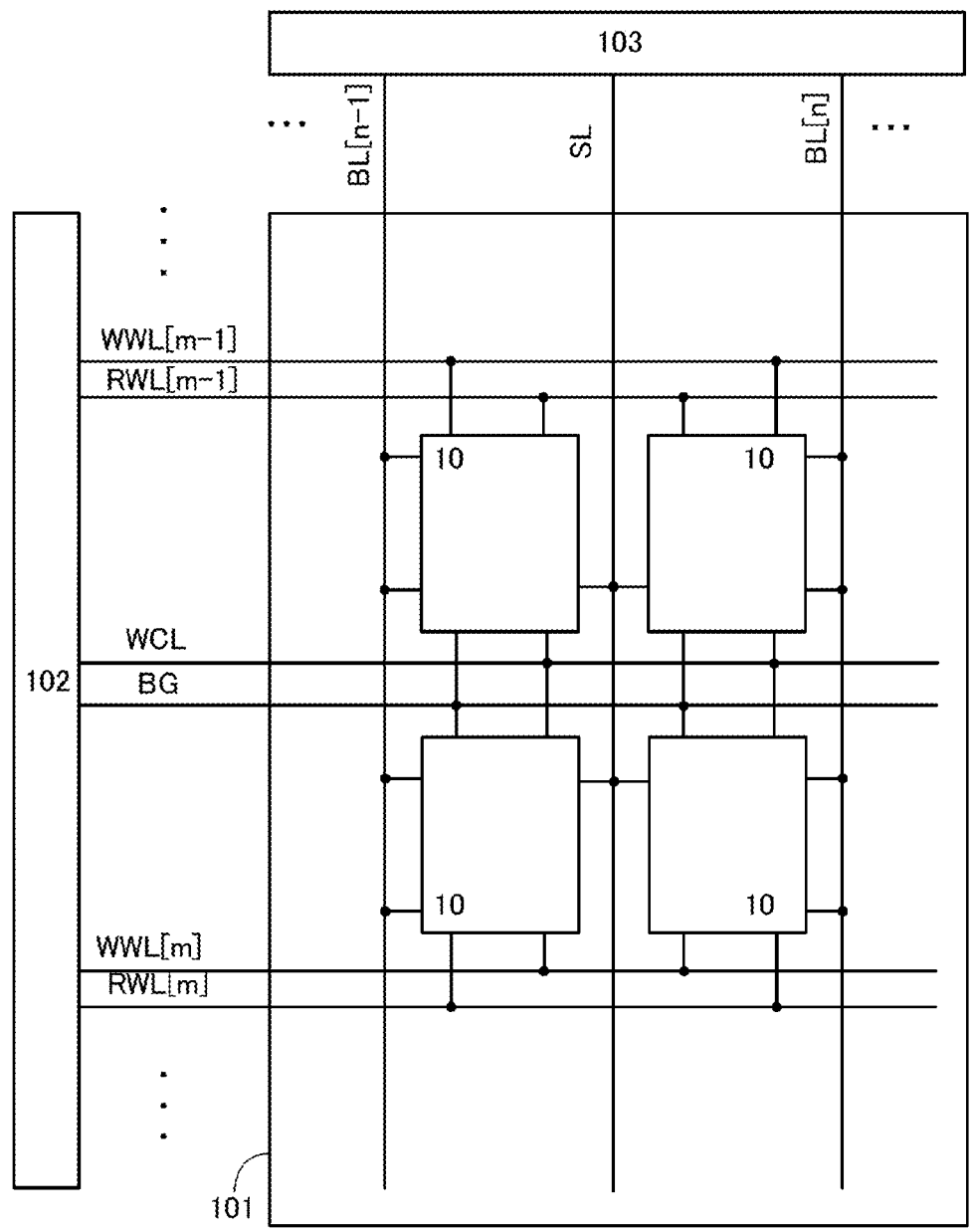
FIG. 10 is a block diagram illustrating a structure example of a memory device.

FIG. 10 is a block diagram illustrating a structure example of a memory device 100 including the memory cell 10a or the memory cell 10b. In the following description, the memory cell 10a and the memory cell 10b are collectively referred to as a memory cell 10.

The memory device 100 in FIG. 10 includes a memory cell array 101 provided with a plurality of memory cells 10, a row driver 102, and a column driver 103. The memory device 100 includes the memory cells 10 arranged in a matrix of m rows (m is a natural number of two or more) and n columns (n is a natural number of two or more).

FIG. 10 shows a wiring WWL[m−1] and a wiring RWL[m−1] that are connected to the memory cells 10 in the (m−1)-th row, a wiring WWL[m] and a wiring RWL[m] that are connected to the memory cells 10 in the m-th row, the wiring WCL that is connected to the memory cells 10 in the (m−1)-th and m-th rows, and the wiring BG that is connected to the memory cells 10 in the (m−1)-th and m-th rows.

In addition, FIG. 10 shows a wiring BL[n−1] that is connected to the memory cells 10 in the (n−1)-th column, a wiring BL[n] that is connected to the memory cells 10 in the n-th column, and the wiring SL that is connected to the memory cells 10 in the (n−1)-th and n-th columns.

In the memory cell array 101 shown in FIG. 10, the wirings SL, WCL, and BG are shared by adjacent memory cells. This structure reduces the area occupied by the wirings. Thus, a memory device with this structure can have high storage capacity per unit area.

The row driver 102 is a circuit having a function of selectively turning on the transistors OS1 and Tr1 in the memory cells 10 of each row. With the row driver 102, the memory cells 10 can be selected row by row, and data can be written and read to/from the selected memory cells 10 in the memory device 100.

The column driver 103 is a circuit having a function of selectively writing data to the node FN in the memory cells 10 of each column, a function of initializing the potential of the wiring BL, and a function of making the wiring BL electrically floating. Specifically, the column driver 103 is a circuit that supplies a potential corresponding to data to the wiring BL. With the column driver 103, the memory cells 10 can be selected column by column, and data can be written and read to/from the selected memory cells 10 in the memory device 100.

By using the memory cell described in this embodiment in the above-described manner, a highly integrated memory cell can be provided. Furthermore, a memory device which stores a large amount of data can be provided. Moreover, a memory device with low power consumption can be provided.

Embodiment 2

In this embodiment, other structure examples of the memory cell described in Embodiment 1 are described with reference to FIGS. 11A and 11B and FIGS. 12A and 12B.

The wiring BL in the memory cells 10a and 10b illustrated in FIGS. 1A and 1B may be separated into a wiring BL1 for data writing and a wiring BL2 for data reading. Structure examples of such a case are illustrated in FIGS. 11A and 11B.

Figure 11A:
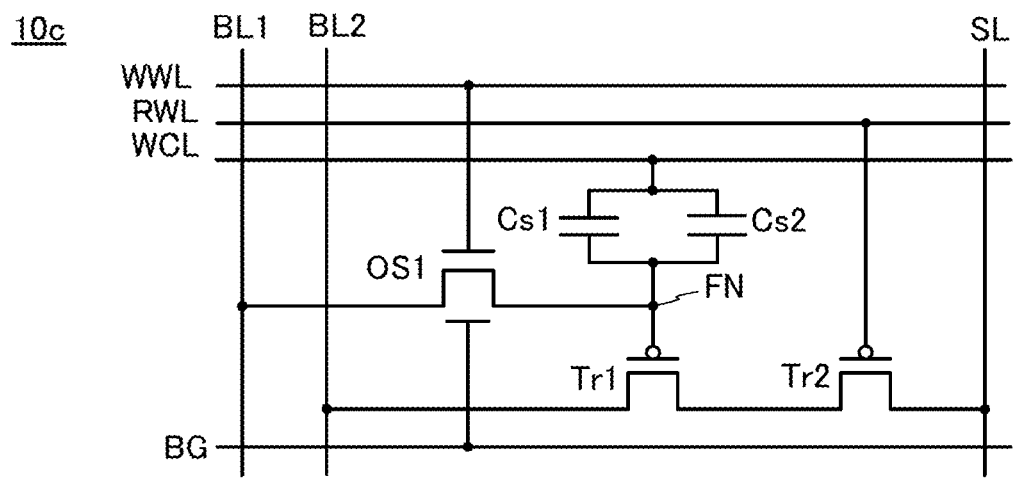
FIGS. 11A and 11B are circuit diagrams illustrating structure examples of a memory cell.

FIG. 11A is a circuit diagram of a memory cell 10c obtained by separating the wiring BL of the memory cell 10a into the wiring BL1 and the wiring BL2. The other of the source and the drain of the transistor OS1 is electrically connected to the wiring BL1, and the other of the source and the drain of the transistor Tr1 is electrically connected to the wiring BL2.

Figure 11B:
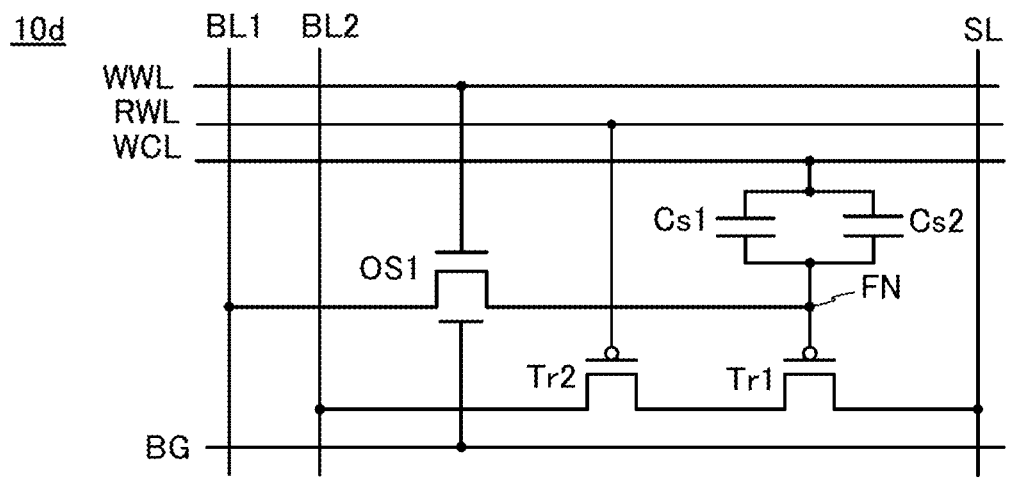

FIG. 11B is a circuit diagram of a memory cell 10d obtained by separating the wiring BL of the memory cell 10b into the wiring BL1 and the wiring BL2. The other of the source and the drain of the transistor OS1 is electrically connected to the wiring BL1, and the other of the source and the drain of the transistor Tr1 is electrically connected to the wiring BL2 through the transistor Tr2.

Separation of the wiring BL into the wiring for data writing and the wiring for data reading as in the memory cell 10c and the memory cell 10d enables data writing and data reading to be independently performed, which can increase the freedom of operation of the memory cell.

In the memory cells 10a and 10b illustrated in FIGS. 1A and 1B, the transistor Tr2 and the wiring RWL may be omitted. The circuit diagrams of such a case are illustrated in FIGS. 12A and 12B.

Figure 12A:
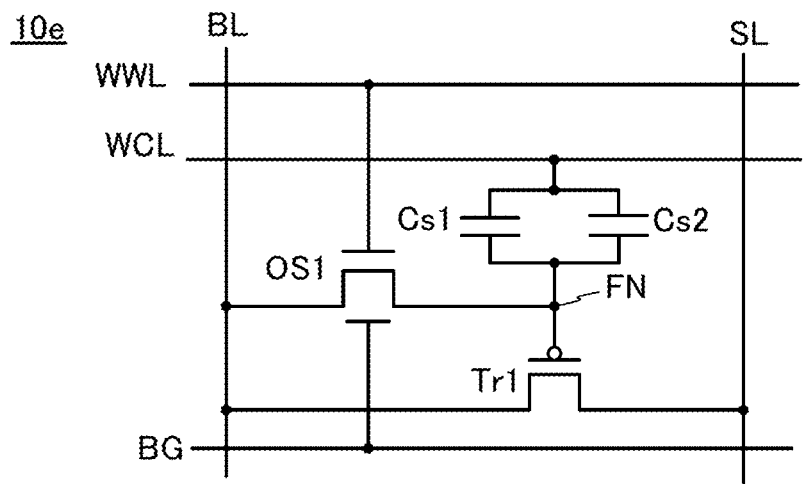
FIGS. 12A and 12B are circuit diagrams illustrating structure examples of a memory cell.

FIG. 12A is a circuit diagram of a memory cell 10e obtained by omitting the transistor Tr2 and the wiring RWL of the memory cell 10a or 10b. In this case, data can be read by the supply of a L-level potential to the wiring WCL. Because the memory cell 10e has a smaller number of transistors and wirings than the memory cell 10a or 10b, a reduction in size and high integration of the memory cell are possible.

Figure 12B:
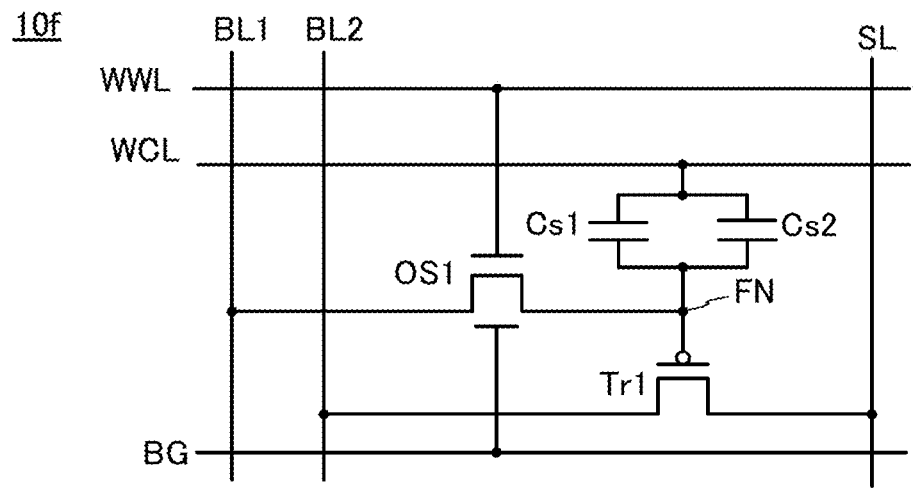

FIG. 12B is a circuit diagram of a memory cell 10f obtained by separating the wiring BL of the memory cell 10e into the wiring BL1 for data writing and the wiring BL2 for data reading. The other of the source and the drain of the transistor OS1 is electrically connected to the wiring BL1, and the other of the source and the drain of the transistor Tr1 is electrically connected to the wiring BL2. In this way, data writing and data reading can be independently performed, which can increase the freedom of operation of the memory cell.

Embodiment 3

In this embodiment, another structure example of the transistor Tr1 and the transistor Tr2 described in Embodiment 1 are described with reference to FIGS. 13A to 13C.

Figure 13A:
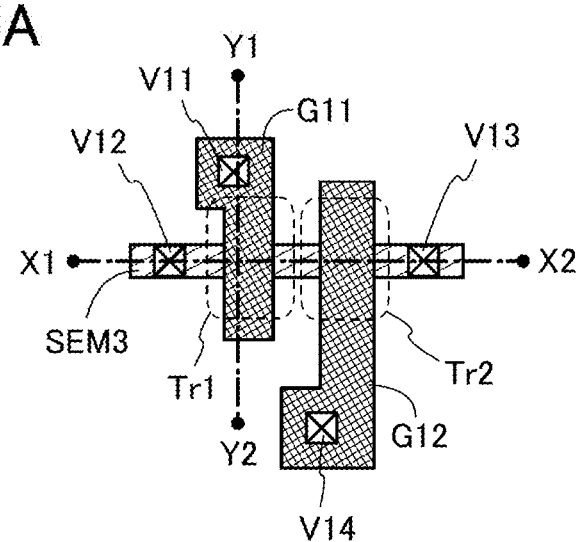
FIGS. 13A to 13C are a top view and cross-sectional views illustrating a structure example of transistors Tr1 and Tr2.

FIG. 13A is a top view of the transistor Tr1 and the transistor Tr2 (the same as the top view of FIG. 3A). FIG. 13B is a cross-sectional view taken along a dashed-dotted line X1-X2 in FIG. 13A, and FIG. 13C is a cross-sectional view taken along a dashed-dotted line Y1-Y2 in FIG. 13A. Note that the direction along the dashed-dotted line X1-X2 may be referred to as the channel length direction of the transistors Tr1 and Tr2, and the direction along the dashed-dotted line Y1-Y2 may be referred to as the channel width direction of the transistor Tr1.

Figure 13B:
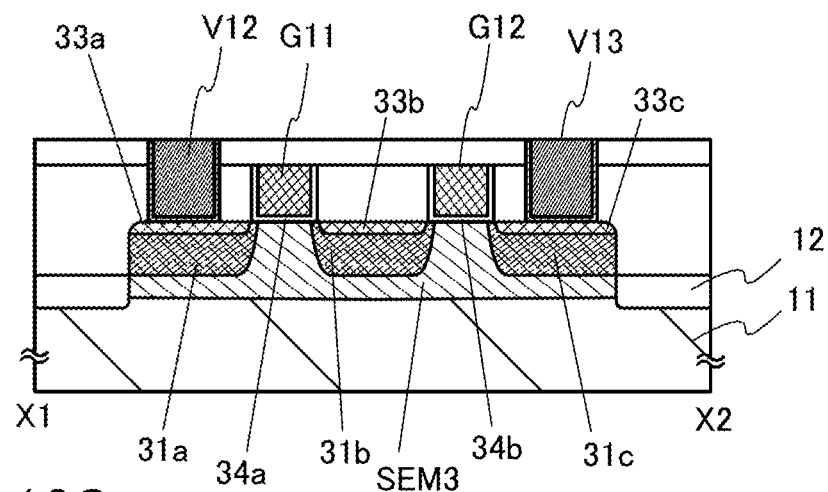
Figure 13C:
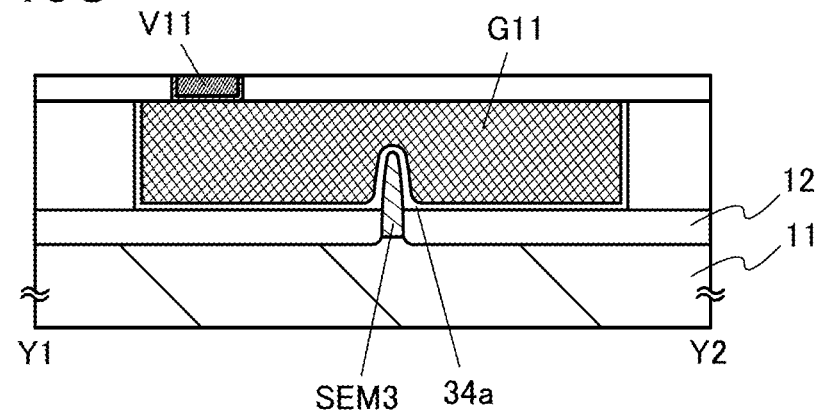

The transistors Tr1 and Tr2 illustrated in FIGS. 13A to 13C include a semiconductor SEM3 having a projection shape. Along side surfaces and top surfaces of the semiconductor SEM3, the insulators 34a and 34b and the conductors G11 and G12 are provided. The transistor with such a shape is referred to as a FIN-type transistor. Although the projecting portion is formed by processing part of the substrate 11 in this embodiment, the projection shape may be formed by processing an SOI substrate.

A FIN-type transistor has a structure in which a top surface and both side surfaces of a channel formation region are covered with a gate electrode. This structure allows an effective application of a gate electric field to the channel formation region. Thus, on-state current of the transistor can be increased and a short channel effect can be suppressed.

Figure 7C:
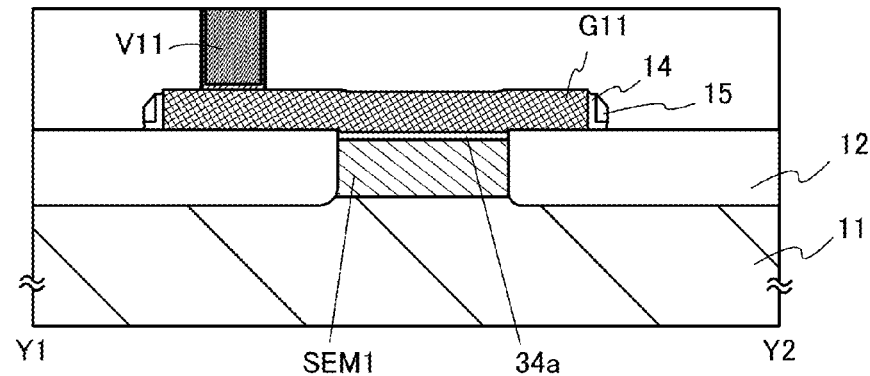

For the details on the other components illustrated in FIGS. 13A to 13C, the description of FIGS. 7A to 7C is referred to.

Embodiment 4

In this embodiment, other structure examples of the transistor OS1 described in Embodiment 1 are described with reference to FIGS. 14A to 14C and FIGS. 15A to 15C.

Structure Example 1

Figure 14A:
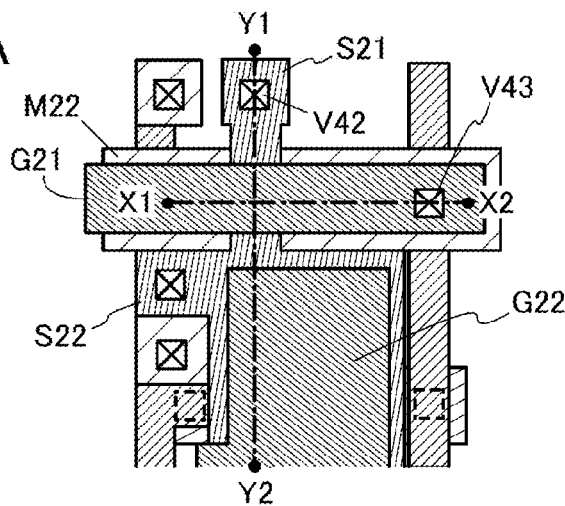
FIGS. 14A to 14C are a top view and cross-sectional views illustrating a structure example of a transistor OS1.
Figure 14B:
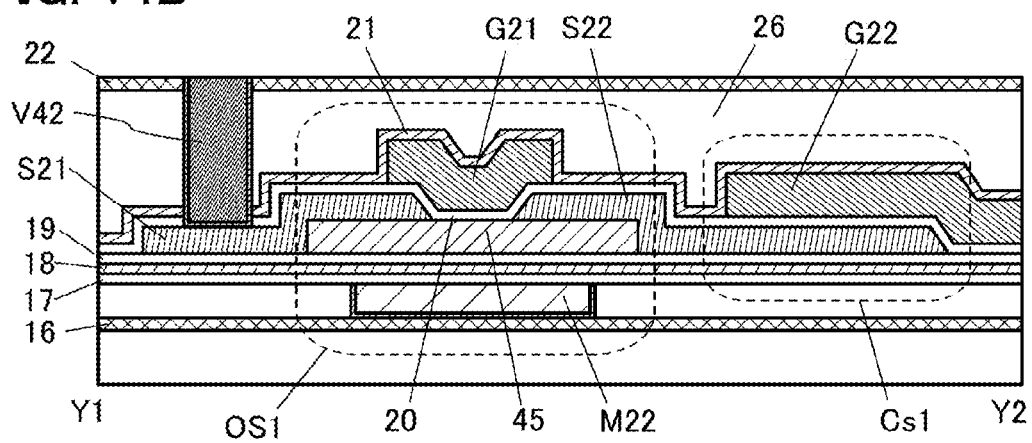
Figure 14C:
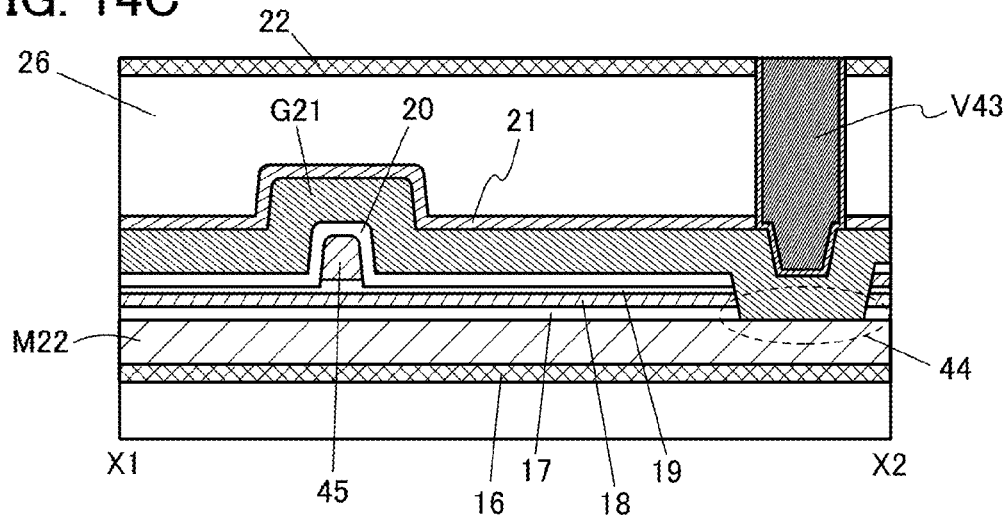

FIG. 14A is a top view illustrating part of the memory cell 10a, which is the transistor OS1 and the capacitor Cs1. FIG. 14B is a cross-sectional view taken along a dashed-dotted line Y1-Y2 in FIG. 14A, and FIG. 14C is a cross-sectional view taken along a dashed-dotted line X1-X2 in FIG. 14A. Note that the direction along the dashed-dotted line Y1-Y2 may be referred to as the channel length direction of the transistor OS1, and the direction along the dashed-dotted line X1-X2 may be referred to as the channel width direction of the transistor OS1.

In contrast to the memory cell 10a illustrated in the cross-sectional view of FIG. 6, the memory cell 10a in FIG. 14B does not include the oxide semiconductor 43 and includes an oxide semiconductor 45 instead of the oxide semiconductors 41 and 42. In addition, the conductors S21 and S22 are provided in contact with side surfaces of the oxide semiconductor 45. Furthermore, the insulator 21 is provided so as to cover the transistor OS1 and the capacitor Cs1. Thus, the manufacturing process of the memory cell 10a can be simplified.

In FIGS. 14A to 14C, the insulator 20 has a function of the gate insulator of the transistor OS1 and a function of the dielectric of the capacitor Cs1. The conductor S22 has a function of one of the source and the drain of the transistor OS1 and a function of the first electrode of the capacitor Cs1.

As in FIG. 6, the thickness of the dielectric (the insulator 20) of the capacitor Cs1 in FIGS. 14B and 14C is preferably smaller than that of the dielectric of the capacitor Cs2.

As the oxide semiconductor 45, an oxide semiconductor that can be used as the oxide semiconductors 41 to 43 can be used.

For the details on the other components illustrated in FIGS. 14A to 14C, the description of FIG. 6 and FIGS. 8A to 8C is referred to.

Structure Example 2

Figure 15A:
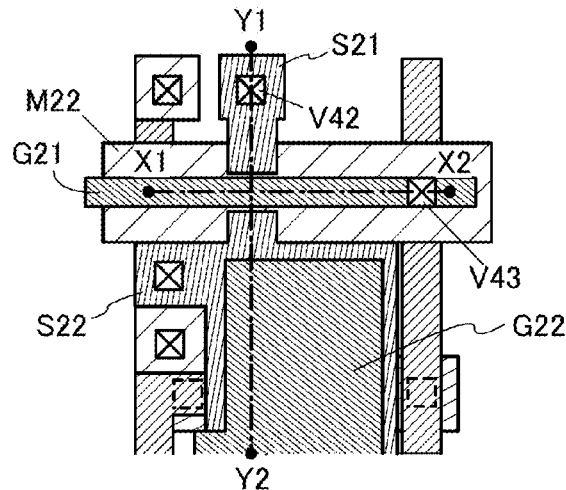
FIGS. 15A to 15C are a top view and cross-sectional views illustrating a structure example of a transistor OS1.
Figure 15B:
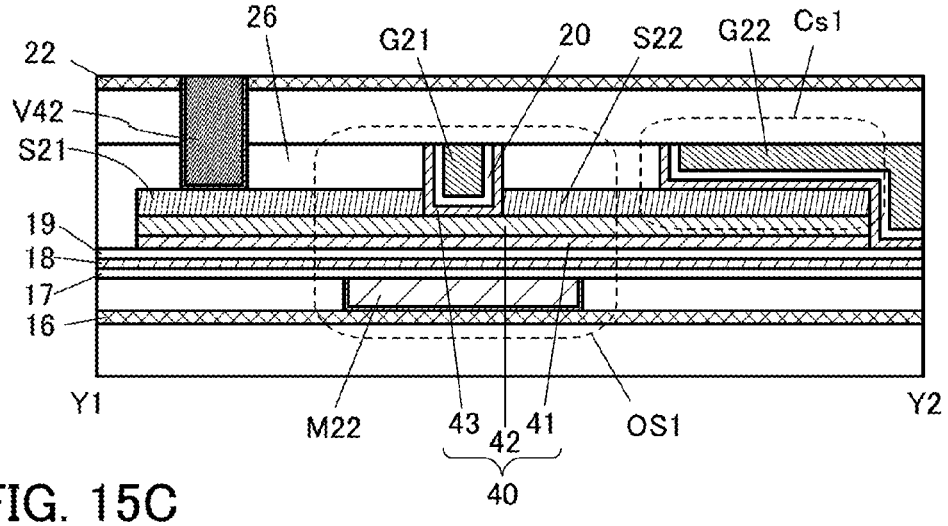
Figure 15C:
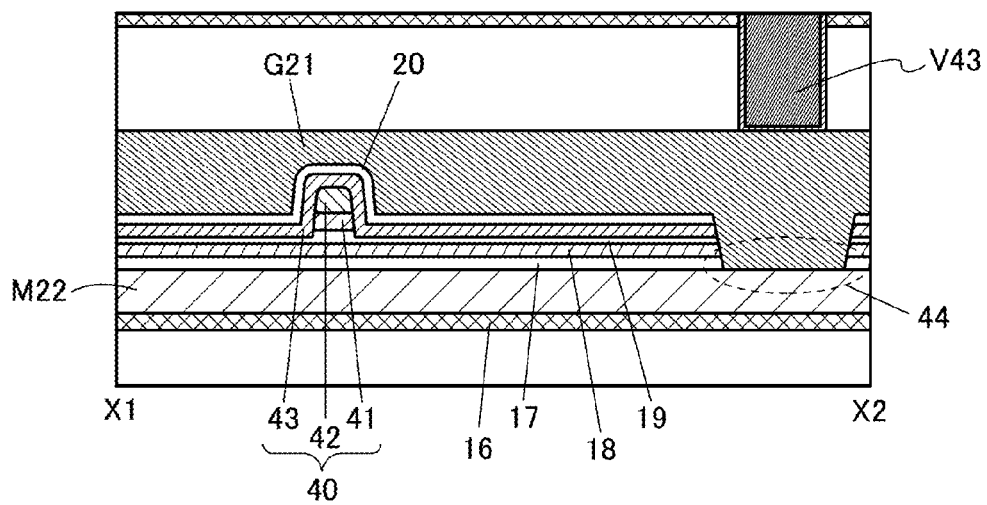

FIG. 15A is a top view illustrating part of the memory cell 10a, which is the transistor OS1 and the capacitor Cs1. FIG. 15B is a cross-sectional view taken along a dashed-dotted line Y1-Y2 in FIG. 15A, and FIG. 15C is a cross-sectional view taken along a dashed-dotted line X1-X2 in FIG. 15A. Note that the direction along the dashed-dotted line Y1-Y2 may be referred to as the channel length direction of the transistor OS1, and the direction along the dashed-dotted line X1-X2 may be referred to as the channel width direction of the transistor OS1.

In FIGS. 15A to 15C, the insulator 20 has a function of the gate insulator of the transistor OS1 and a function of the dielectric of the capacitor Cs1. The conductor S22 has a function of one of a source and a drain of the transistor OS1 and a function of the first electrode of the capacitor Cs1.

As in FIG. 6, the thickness of the dielectric of the capacitor Cs1 (the insulator 20) in FIGS. 15B and 15C is preferably smaller than that of the dielectric of the capacitor Cs2.

In the transistor OS1 illustrated in FIGS. 15A to 15C, the oxide semiconductor 43, the insulator 20, and the conductor G21 are formed in an opening formed in the insulator 26.

Because the transistor OS1 has a structure in which the conductor G21 and the conductor S21 (the conductor G21 and the conductor S22) do not overlap with each other, parasitic capacitance between the conductor G21 and the conductor S21 (or parasitic capacitance between the conductor G21 and the conductor S22) can be reduced. In other words, the transistor can have a high operation frequency.

For the details on the other components illustrated in FIGS. 15A to 15C, the description of FIG. 6 and FIGS. 8A to 8C is referred to.

Embodiment 5

In this embodiment, a semiconductor device which includes the memory device described in Embodiment 1 is described.

For example, the memory device is incorporated in a processor (also referred to as "processing unit") and stores data (including an instruction) necessary for the operation of the processor. Examples of the processor include a CPU, a graphics processing unit (GPU), a programmable logic device (PLD), a digital signal processor (DSP), a microcontroller unit (MCU), a custom LSI, and an RFIC.

<<CPU>>

Figure 16:
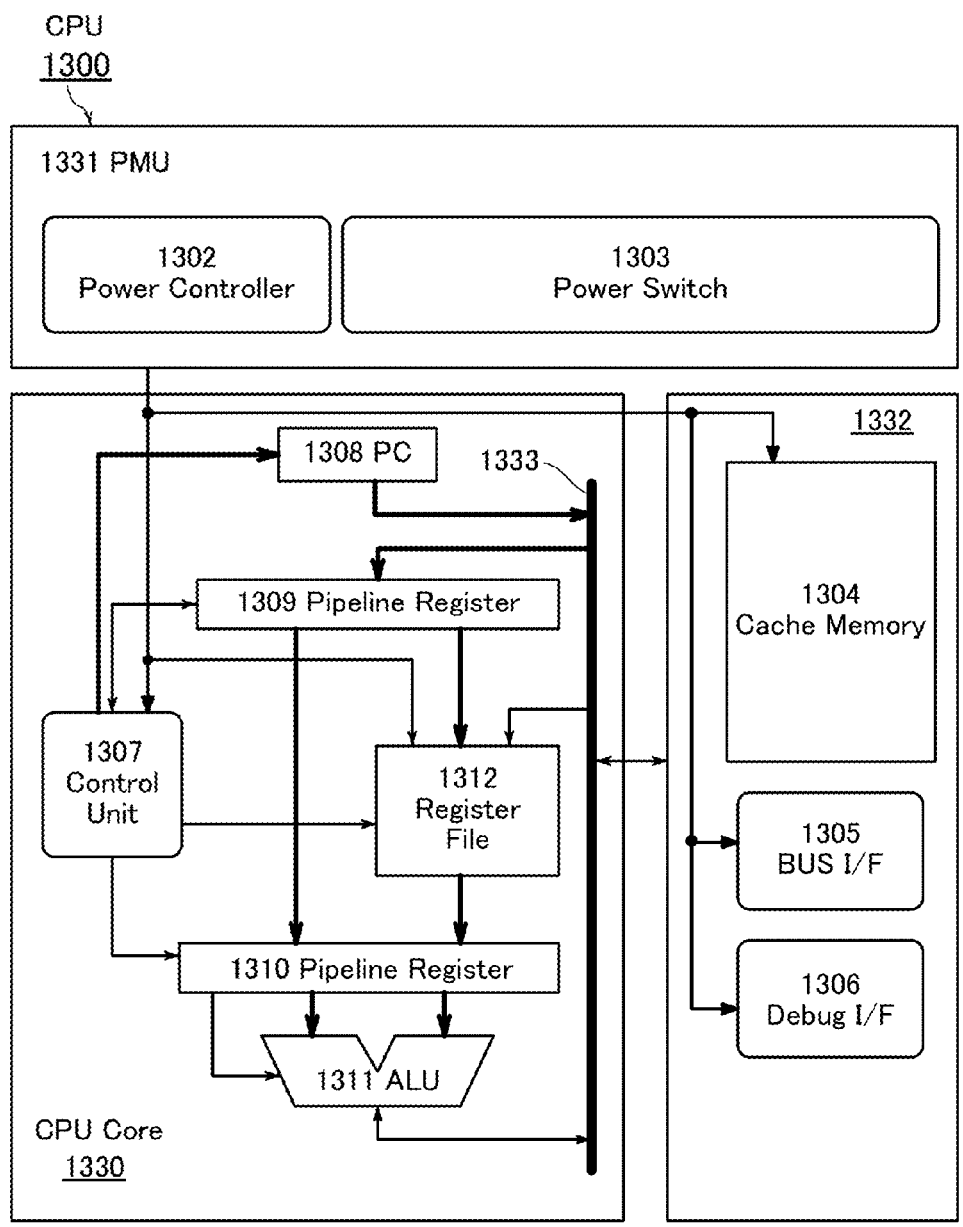
FIG. 16 is a block diagram illustrating a configuration example of a CPU.

FIG. 16 is a block diagram illustrating a configuration example of a CPU. A CPU 1300 illustrated in FIG. 16 includes a CPU core 1330, a power management unit (PMU) 1331, and a peripheral circuit 1332.

The CPU core 1330 includes a control unit 1307, a program counter (PC) 1308, a pipeline register 1309, a pipeline register 1310, an arithmetic logic unit (ALU) 1311, a register file 1312, and a data bus 1333. Data is transmitted between the CPU core 1330 and the peripheral circuit 1332 via the data bus 1333.

The PMU 1331 includes a power controller 1302 and a power switch 1303. The peripheral circuit 1332 includes a cache memory 1304, a bus interface (BUS I/F) 1305, and a debug interface (Debug I/F) 1306.

The memory device described in Embodiment 1 can be used in the cache memory 1304. This can suppress an increase in area and power consumption and increase the capacity of the cache memory 1304. Moreover, the standby power of the cache memory 1304 can be reduced; accordingly, the CPU 1300 with small size and low power consumption can be provided.

The control unit 1307 has functions of decoding and executing instructions contained in a program such as inputted applications by controlling the overall operations of the program counter 1308, the pipeline registers 1309 and 1310, the ALU 1311, the register file 1312, the cache memory 1304, the bus interface 1305, the debug interface 1306, and the power controller 1302.

The ALU 1311 has a function of performing a variety of arithmetic operations such as four arithmetic operations and logic operations. The cache memory 1304 has a function of temporarily storing frequently used data. The program counter 1308 is a register having a function of storing an address of an instruction to be executed next. Although not illustrated in FIG. 16, the cache memory 1304 is provided with a control circuit for controlling the operation of the cache memory 1304.

The pipeline register 1309 has a function of temporarily storing instruction data. The register file 1312 includes a plurality of registers including a general purpose register and can store data that is read from the main memory, data obtained as a result of arithmetic operations in the ALU 1311, or the like. The pipeline register 1310 has a function of temporarily storing data used for arithmetic operations performed in the ALU 1311, data obtained as a result of arithmetic operations in the ALU 1311, or the like.

The bus interface 1305 functions as a path for data between the CPU 1300 and devices outside the CPU 1300. The debug interface 1306 functions as a path of a signal for inputting an instruction to control debugging to the CPU 1300.

The power switch 1303 has a function of controlling supply of the power supply voltage to circuits other than the power controller 1302 in the CPU 1300. The CPU 1300 includes several power domains, and a power-gated circuit belongs to any one of the power domains in the CPU 1300. The power switch 1303 controls whether the power supply voltage is supplied to circuits in the same power domain. The power controller 1302 has a function of controlling the operation of the power switch 1303. With such a power supply management system, the CPU 1300 can perform power gating.

<<RFIC>>

An RFIC is described as an example of a processor. The RFIC is referred to as an RF tag, a wireless chip, a wireless ID chip, and the like. The RFIC includes a memory circuit, stores necessary data in the memory circuit, and transmits and receives data to/from the outside by using contactless means, for example, wireless communication. With these features, the RFIC can be used for an individual authentication system in which an object or the like is recognized by reading the individual information, for example.

Figure 17:
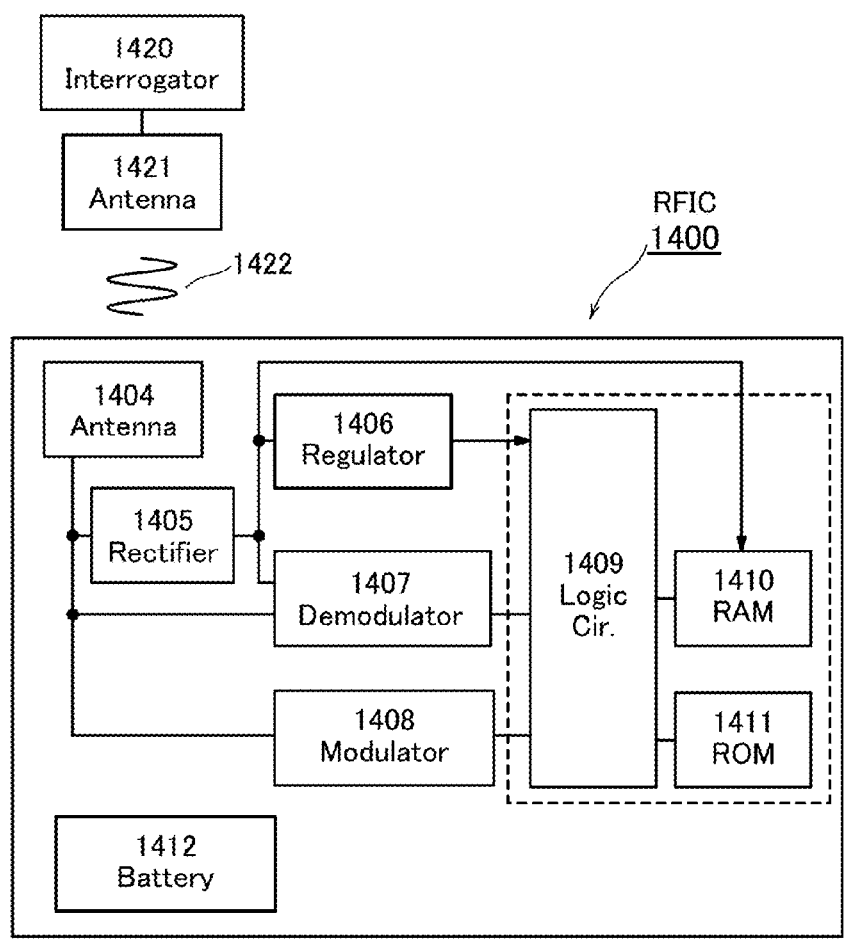
FIG. 17 is a block diagram illustrating a configuration example of an RFIC.

FIG. 17 is a block diagram illustrating a configuration example of an RFIC. An RFIC 1400 includes an antenna 1404, a rectifier circuit 1405, a constant voltage circuit 1406, a demodulation circuit 1407, a modulation circuit 1408, a logic circuit 1409, a RAM 1410, a read-only memory (ROM) 1411, and a battery 1412. Note that decision whether each of these circuits is provided or not can be made as needed. For example, although the RFIC 1400 is of an active type, it may be of a passive type without the battery 1412. Here, although the RFIC 1400 is a semiconductor device including the antenna 1404, a semiconductor device not including the antenna 1404 can also be referred to as the RFIC 1400.

The memory device of Embodiment 1 can be used in the RAM 1410. Because the memory device of Embodiment 1 has high compatibility with a CMOS circuit, circuits other than the antenna 1404 can be incorporated in one chip of the RFIC 1400, without complicating the manufacturing process. The antenna 1404 whose performance corresponds to the communication zone is mounted on the chip. As data transmission methods, the following methods can be given: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RFIC 1400 described in this embodiment.

The antenna 1404 exchanges a radio signal 1422 with an antenna 1421 which is connected to a communication device 1420. The rectifier circuit 1405 generates an input voltage by rectification, for example, half-wave voltage doubler rectification of an input alternating signal generated by reception of a radio signal at the antenna 1404 and smoothing of the rectified signal with a capacitor provided in a later stage in the rectifier circuit 1405. Note that a limiter circuit may be provided on the input side or the output side of the rectifier circuit 1405. The limiter circuit controls electric power so that electric power which is higher than or equal to a certain level of electric power is not input to a circuit in a later stage if the amplitude of the input alternating signal is high and an internal generation voltage is high.

The constant voltage circuit 1406 generates a stable power supply voltage from an input voltage and supplies it to each circuit. Note that the constant voltage circuit 1406 may include a reset signal generation circuit. The reset signal generation circuit is a circuit which generates a reset signal of the logic circuit 1409 by utilizing the rise of the stable power supply voltage.

The demodulation circuit 1407 demodulates the input alternating signal by envelope detection and generates the demodulated signal. Furthermore, the modulation circuit 1408 performs modulation in accordance with data to be output from the antenna 1404.

The logic circuit 1409 decodes and processes the demodulated signal. The RAM 1410 retains the input data and includes a row decoder, a column decoder, a driver, a memory region, and the like. Furthermore, the ROM 1411 stores an identification number (ID) or the like and outputs it in accordance with processing.

Embodiment 6

In this embodiment, examples of a semiconductor wafer, an IC chip, and an electronic component each including the memory device or the semiconductor device described in the above embodiments are described with reference to FIGS. 18A and 18B and FIGS. 19A and 19B.

[Semiconductor Wafer and Chip]

Figure 18A:
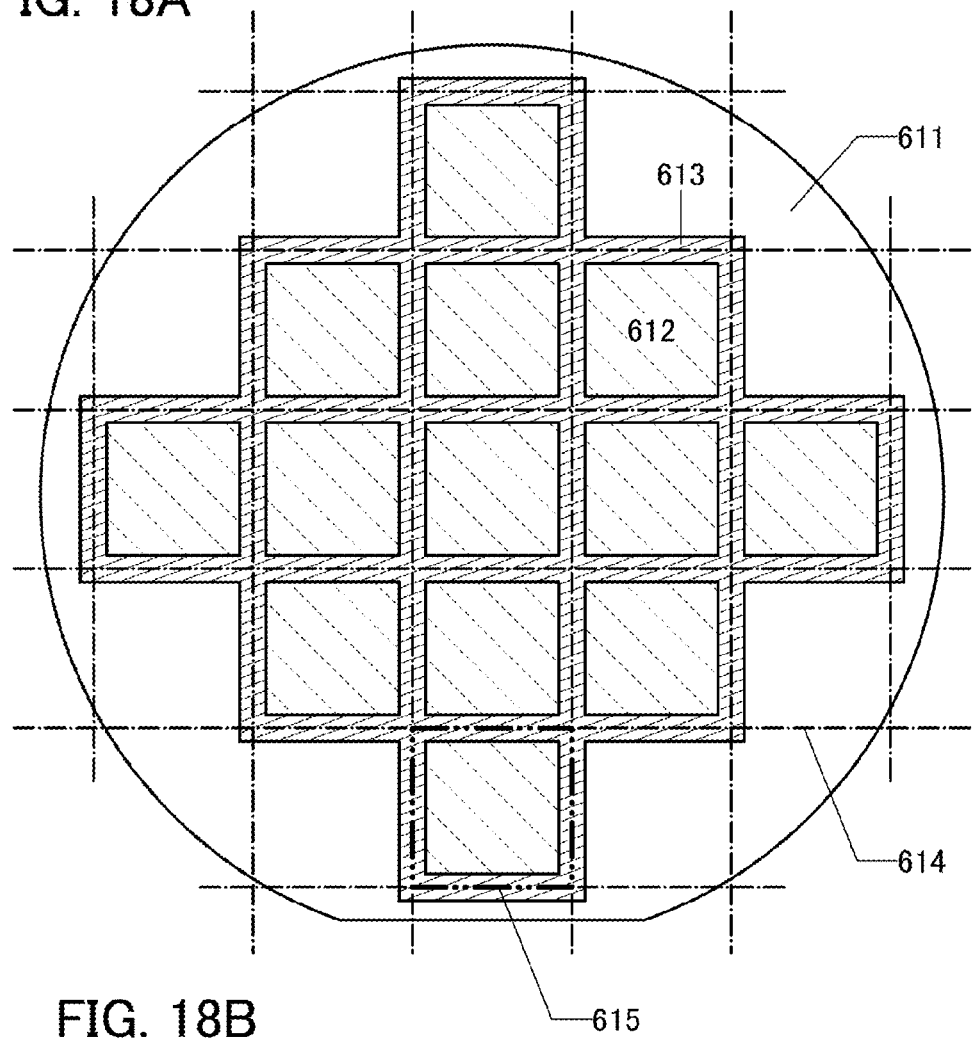
FIGS. 18A and 18B are top views of a semiconductor wafer.

FIG. 18A is a top view illustrating a substrate 611 before dicing treatment. As the substrate 611, a semiconductor substrate (also referred to as "semiconductor wafer") can be used, for example. The substrate 611 has a plurality of circuit regions 612. The semiconductor device shown in any of the foregoing embodiments, for example, can be provided in the circuit region 612.

Figure 18B:
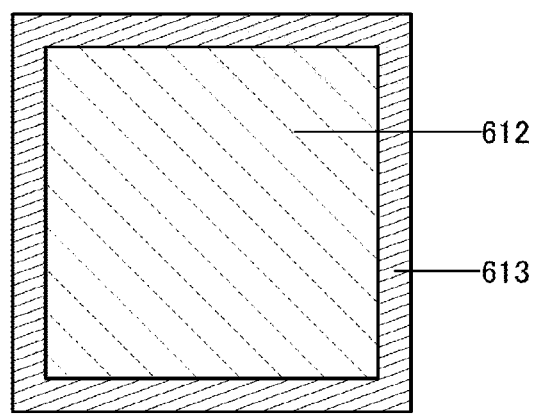

Each of the circuit regions 612 is surrounded by a separation region 613. Separation lines (also referred to as "dicing lines") 614 are set at a position overlapping the separation regions 613. Chips 615 each including the circuit region 612 can be cut from the substrate 611 by cutting the substrate 611 along the separation lines 614. FIG. 18B is an enlarged view of the chip 615.

A conductive layer or a semiconductor layer may be provided in the separation regions 613. Providing a conductive layer or a semiconductor layer in the separation regions 613 relieves electrostatic discharge (ESD) that might be caused in a dicing step, preventing a decrease in the yield in the dicing step. A dicing step is generally performed while letting pure water whose specific resistance is decreased by the inclusion of a carbonic acid gas or the like flow to a cut portion, in order to cool down a substrate, remove swarf, and prevent electrification, for example. Providing a conductive layer or a semiconductor layer in the separation regions 613 allows a reduction in the usage of the pure water. Therefore, the cost of manufacturing the semiconductor device can be reduced. Moreover, the semiconductor device can be manufactured with improved productivity.

For a semiconductor layer provided in the separation regions 613, it is preferable to use a material having a bandgap greater than or equal to 2.5 eV and less than or equal to 4.2 eV, preferably greater than or equal to 2.7 eV and less than or equal to 3.5 eV. The use of such a material allows accumulated charge to be released slowly; thus, rapid move of charge due to ESD can be suppressed and electrostatic breakdown is less likely to occur.

[Electronic Component]

Figure 19A:
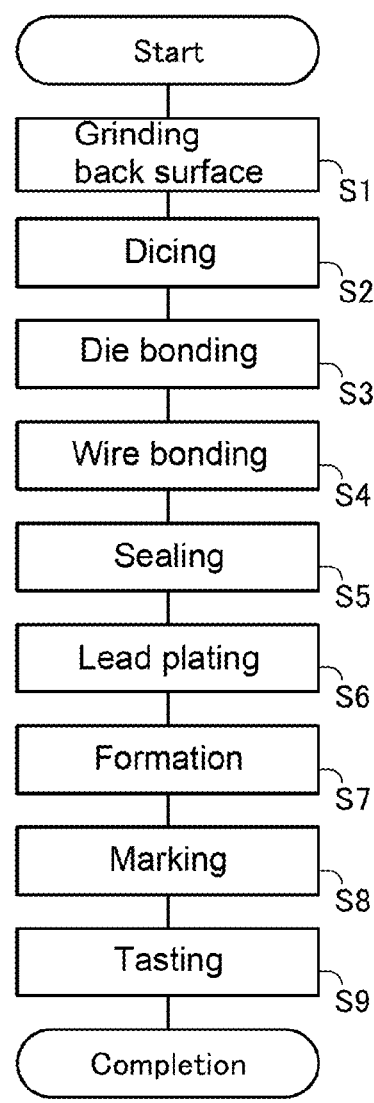
FIG. 19A is a flow chart of a method for manufacturing a semiconductor device.
Figure 19B:
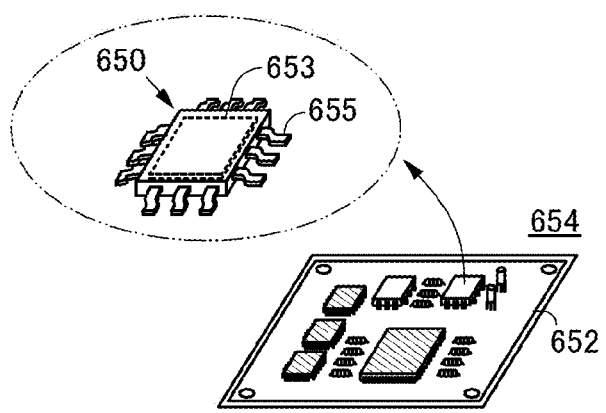
FIG. 19B is a perspective view of the semiconductor device.

FIGS. 19A and 19B show an example of using the chip 615 to make an electronic component. Note that an electronic component is also referred to as a semiconductor package or an IC package. For electronic components, there are various standards and names corresponding to the direction or the shape of terminals.

An electronic component is completed by combining the semiconductor device described in any of the above embodiments and components other than the semiconductor device in the assembly process (post-process).

The post-process is described with reference to a flow chart in FIG. 19A. After an element substrate including the semiconductor device described in any of the above embodiments is completed in the wafer process, a back surface grinding step is performed to grind a back surface (a surface where the semiconductor device and the like are not formed) of the element substrate (Step S1). When the element substrate is thinned by grinding, warpage or the like of the element substrate is reduced, resulting in the reduction in size of the electronic component.

Next, a dicing step is performed to divide the element substrate into a plurality of chips (Step S2). Then, a die bonding step is performed to pick up the divided chips separately and bond them to a lead frame (Step S3). To bond a chip and a lead frame in the die bonding step, resin bonding, tape-automated bonding, or the like is selected as determined as appropriate by products. Note that the chip may be bonded to an interposer instead of the lead frame.

Next, a wire bonding step is performed to electrically connect a lead of the lead frame and an electrode on the chip through a metal fine line (wire) (Step S4). A silver line or a gold line can be used as the metal fine line. Ball bonding or wedge bonding can be used as the wire bonding.

The wire-bonded chip is subjected to a sealing step (molding step) of sealing the chip with an epoxy resin or the like (Step S5). Through the sealing step, the inside of the electronic component is filled with a resin, so that a circuit portion incorporated in the chip and a wire for connecting the chip to the lead can be protected from external mechanical force, and deterioration of characteristics (decrease in reliability) due to moisture or dust can be reduced.

Subsequently, a lead plating step is performed to plate the lead of the lead frame (Step S6). With the plating process, corrosion of the lead can be prevented, and soldering for mounting the electronic component on a printed circuit board in a later step can be performed with higher reliability. Then, a lead processing step is performed to cut and process the lead (Step S7).

Next, a marking step is performed to printing (marking) on a surface of the package (Step S8). After a testing step (Step S9) for checking whether an external shape is good and whether there is malfunction, for example, the electronic component is completed.

FIG. 19B is a schematic perspective view of the completed electronic component. FIG. 19B shows a perspective schematic diagram of a quad flat package (QFP) as an example of the electronic component. An electronic component 650 illustrated in FIG. 19B includes a lead 655 and a semiconductor device 653. As the semiconductor device 653, the memory device or the semiconductor device described in any of the above embodiments can be used, for instance.

The electronic component 650 in FIG. 19B is, for example, mounted on a printed circuit board 652. A plurality of electronic components 650 are used in combination and electrically connected to each other over the printed wiring board 652; thus, a board 654 on which the electronic components are mounted is completed. The completed board 654 is used in an electronic device or the like.

Embodiment 7

The memory device or semiconductor device described in the above embodiment is preferably used in an electronic device incorporating a battery, in which case power consumption of the electronic device can be reduced, and power of the battery can be saved. FIGS. 20A to 20F illustrate specific examples.

Figure 20A:
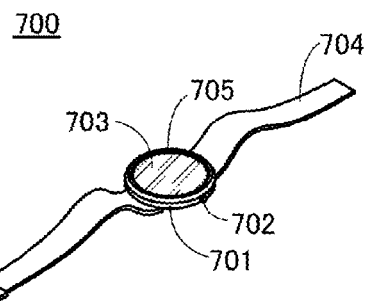
FIGS. 20A to 20F are perspective views illustrating examples of an electronic device.

FIG. 20A illustrates an example of a wristwatch terminal 700. The wristwatch terminal 700 includes a housing 701, a winding crown 702, a display portion 703, a belt 704, a sensing unit 705, and the like. A battery and the memory or semiconductor device are provided inside the housing 701. The display portion 703 may be provided with a touch panel. A user can input information by using a finger touching the touch panel as a pointer.

The sensing unit 705 has a function of obtaining information by measuring a surrounding state. For example, a camera, an acceleration sensor, a direction sensor, a pressure sensor, a temperature sensor, a humidity sensor, an illuminance sensor, or a global positioning system (GPS) signal receiver circuit can be used as the sensing unit 705.

For example, when an arithmetic device in the housing 701 determines that the ambient light level measured by an illuminance sensor of the sensing unit 705 is sufficiently higher than predetermined illuminance, the luminance of the display portion 703 is lowered. Meanwhile, when the arithmetic device determines that the ambient light level is not sufficiently high, the luminance of the display portion 703 is increased. As a result, power consumption of the electronic device can be reduced.

Figure 20B:
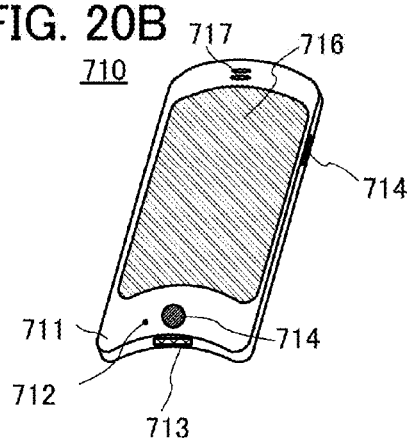

FIG. 20B illustrates a mobile phone 710. The mobile phone 710 includes a housing 711, a display portion 716, operation buttons 714, an external connection port 713, a speaker 717, a microphone 712, and the like. A battery and the memory or semiconductor device are provided inside the housing 711. When the display portion 716 of the mobile phone 710 is touched with a finger or the like, data can be input to the mobile phone 710. Operations such as making a call and inputting letters can be performed by touch on the display portion 716 with a finger or the like. The power can be turned on or off with the operation button 714. Moreover, types of images displayed on the display portion 716 can be switched with the operation button 714; for example, the screen can be switched from a mail creation screen to a main menu screen.

Figure 20C:
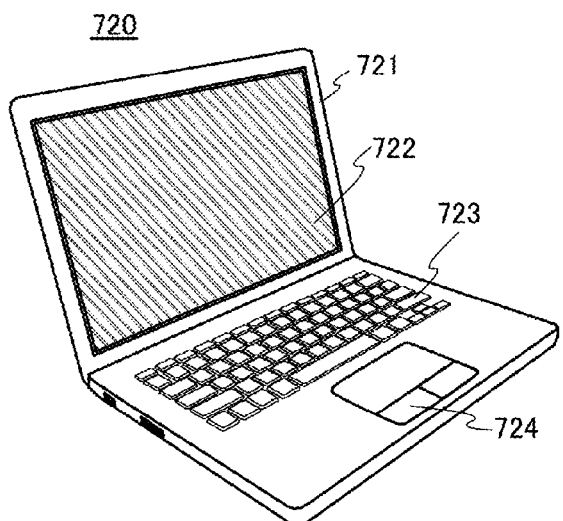

FIG. 20C illustrates a laptop personal computer 720 including a housing 721, a display portion 722, a keyboard 723, a pointing device 724, and the like. A battery and the memory or semiconductor device are provided inside the housing 721.

Figure 20D:
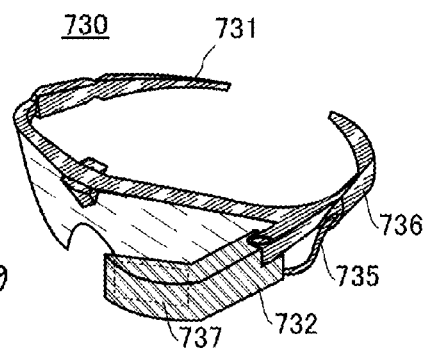

FIG. 20D illustrates a goggle-type display 730. The goggle-type display 730 includes temples 731, a housing 732, a cable 735, a battery 736, and a display portion 737. The battery 736 is held in the temple 731. The display portion 737 is provided in the housing 732. The housing 732 incorporates a variety of electronic components such as a semiconductor device, a wireless communication device, and a memory device. Power is supplied from the battery 736 through the cable 735 to the display portion 737 and the electronic components in the housing 732. A variety of information such as an image transmitted wirelessly is displayed on the display portion 737.

A camera may be provided in the housing 732 of the goggle-type display 730. A user can operate the goggle-type display 730 owing to the camera, which senses movement of the eye and eyelid of the user. The temple 731 of the goggle-type display 730 may be provided with various sensors such as a temperature sensor, a pressure sensor, an acceleration sensor, and a biosensor. For example, the goggle-type display 730 obtains biological information on the user with a biosensor and stores the information in the memory device of the housing 732. The goggle-type display 730 may transmit biological information to another information appliance with a wireless signal.

Figure 20E:
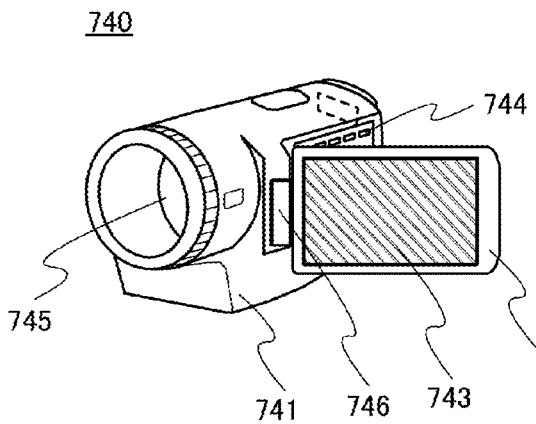

FIG. 20E illustrates a video camera 740. The video camera 740 includes a first housing 741, a second housing 742, a display portion 743, an operation key 744, a lens 745, a joint 746, and the like. The operation key 744 and the lens 745 are provided in the first housing 741, and the display portion 743 is provided in the second housing 742. A battery and the memory or semiconductor device are provided inside the first housing 741. The battery may be provided outside the first housing 741. The first housing 741 and the second housing 742 are connected to each other with the joint 746, and the angle between the first housing 741 and the second housing 742 can be changed with the joint 746. Images on the display portion 743 may be switched in accordance with the angle at the joint 746 between the first housing 741 and the second housing 742.

Figure 20F:
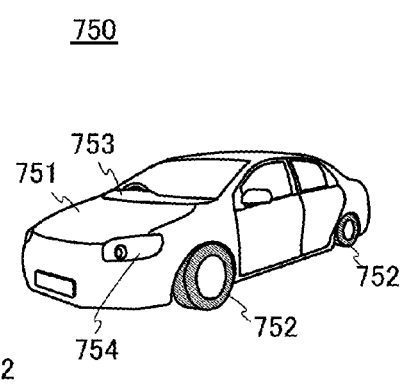

FIG. 20F illustrates an automobile 750. The automobile 750 includes a car body 751, wheels 752, a dashboard 753, lights 754, and the like. A battery and the memory or semiconductor device are provided inside the car body 751.

In this specification and the like, ordinal numbers such as "first," "second," and "third" are used in order to avoid confusion among components. Thus, the terms do not limit the number or order of components. For example, in this specification and the like, a "first" component in one embodiment can be referred to as a "second" component in other embodiments or claims. Furthermore, in this specification and the like, a "first" component in one embodiment can be omitted in other embodiments or claims.

Unless otherwise specified, an on-state current in this specification refers to a drain current of a transistor in an on state. Unless otherwise specified, the on state of an n-channel transistor means that the voltage ($V_G$) between its gate and source is higher than or equal to the threshold voltage ($V_{th}$), and the on state of a p-channel transistor means that $V_G$ is lower than or equal to $V_{th}$. For example, the on-state current of an n-channel transistor refers to a drain current that flows when $V_G$ is higher than or equal to $V_{th}$. The on-state current of a transistor sometimes depends on a voltage ($V_D$) between a drain and a source.

Unless otherwise specified, an off-state current in this specification refers to a drain current of a transistor in an off state. Unless otherwise specified, the off state of an n-channel transistor means that $V_G$ is lower than $V_{th}$, and the off state of a p-channel transistor means that $V_G$ is higher than $V_{th}$. For example, the off-state current of an n-channel transistor refers to a drain current that flows when $V_G$ is lower than $V_{th}$. The off-state current of a transistor depends on $V_G$ in some cases. Thus, "the off-state current of a transistor is lower than $10^{-21}$ A" may mean there is $V_G$ at which the off-state current of the transistor is lower than $10^{-21}$ A.

The off-state current of a transistor depends on $V_D$ in some cases. Unless otherwise specified, the off-state current in this specification may be an off-state current at an absolute value of $V_D$ of 0.1 V, 0.8 V, 1 V, 1.2 V, 1.8 V, 2.5 V, 3 V, 3.3 V, 10 V, 12 V, 16 V, or 20 V. Alternatively, the off-state current may be an off-state current at $V_D$ used in a semiconductor device or the like including the transistor.

In this specification and the like, the terms "one of a source and a drain" (or a first electrode or a first terminal) and "the other of the source and the drain" (or a second electrode or a second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In this specification and the like, the term such as "electrode" or "wiring" does not limit a function of a component. For example, an "electrode" is used as part of a "wiring" in some cases, and vice versa. Moreover, the term "electrode" or "wiring" can also mean a plurality of electrodes or wirings formed in an integrated manner.

In this specification and the like, "voltage" and "potential" can be replaced with each other. The term "voltage" refers to a potential difference from a reference potential. Given that the reference potential is a ground potential, for example, "voltage" can be replaced with "potential." The ground potential does not necessarily mean 0 V. Note that potentials are relative values, and a potential supplied to a wiring or the like is sometimes changed depending on the reference potential.

In this specification and the like, a switch is conducting or not conducting (is turned on or off) to determine whether current flows therethrough or not. Alternatively, a switch has a function of selecting and changing a current path. For example, an electrical switch or a mechanical switch can be used. That is, a switch is not limited to a certain element and can be any element capable of controlling current.

Examples of an electrical switch include a transistor (e.g., a bipolar transistor and a MOS transistor), a diode (e.g., a PN diode, a PIN diode, a Schottky diode, a metal-insulator-metal (MIM) diode, a metal-insulator-semiconductor (MIS) diode, and a diode-connected transistor), and a logic circuit in which such elements are combined.

In the case of using a transistor as a switch, the "on state" of the transistor refers to a state in which a source and a drain of the transistor are regarded as being electrically short-circuited. The "off state" of the transistor refers to a state in which the source and the drain of the transistor are regarded as being electrically disconnected. In the case where a transistor operates just as a switch, there is no particular limitation on the polarity (conductivity type) of the transistor.

An example of a mechanical switch is a switch using a microelectromechanical system (MEMS) technology, such as a digital micromirror device (DMD). Such a switch includes an electrode that can be moved mechanically, and its conduction and non-conduction is controlled with movement of the electrode.

For example, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, or a load) is not connected between X and Y, and the case where X and Y are connected without the element that allows the electrical connection between X and Y provided therebetween.

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y.

For example, in the case where X and Y are functionally connected, one or more circuits that enable a functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path" and "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path." Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Example

In this example, the storage capacity and retention time of a memory cell with the varying memory cell area were calculated.

Figure 21:
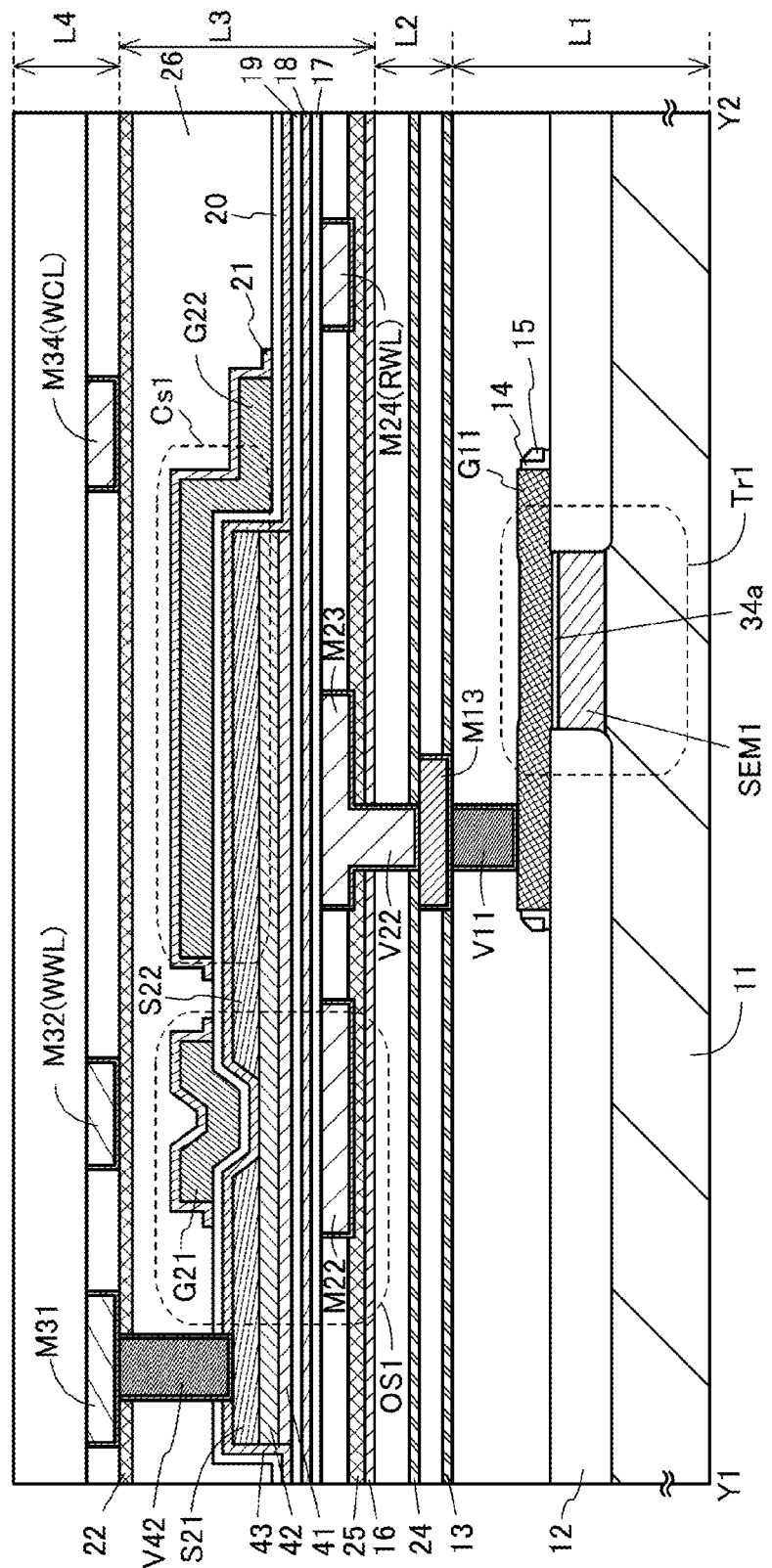
FIG. 21 is a cross-sectional view illustrating a structure example of a memory cell.
Figure 22:
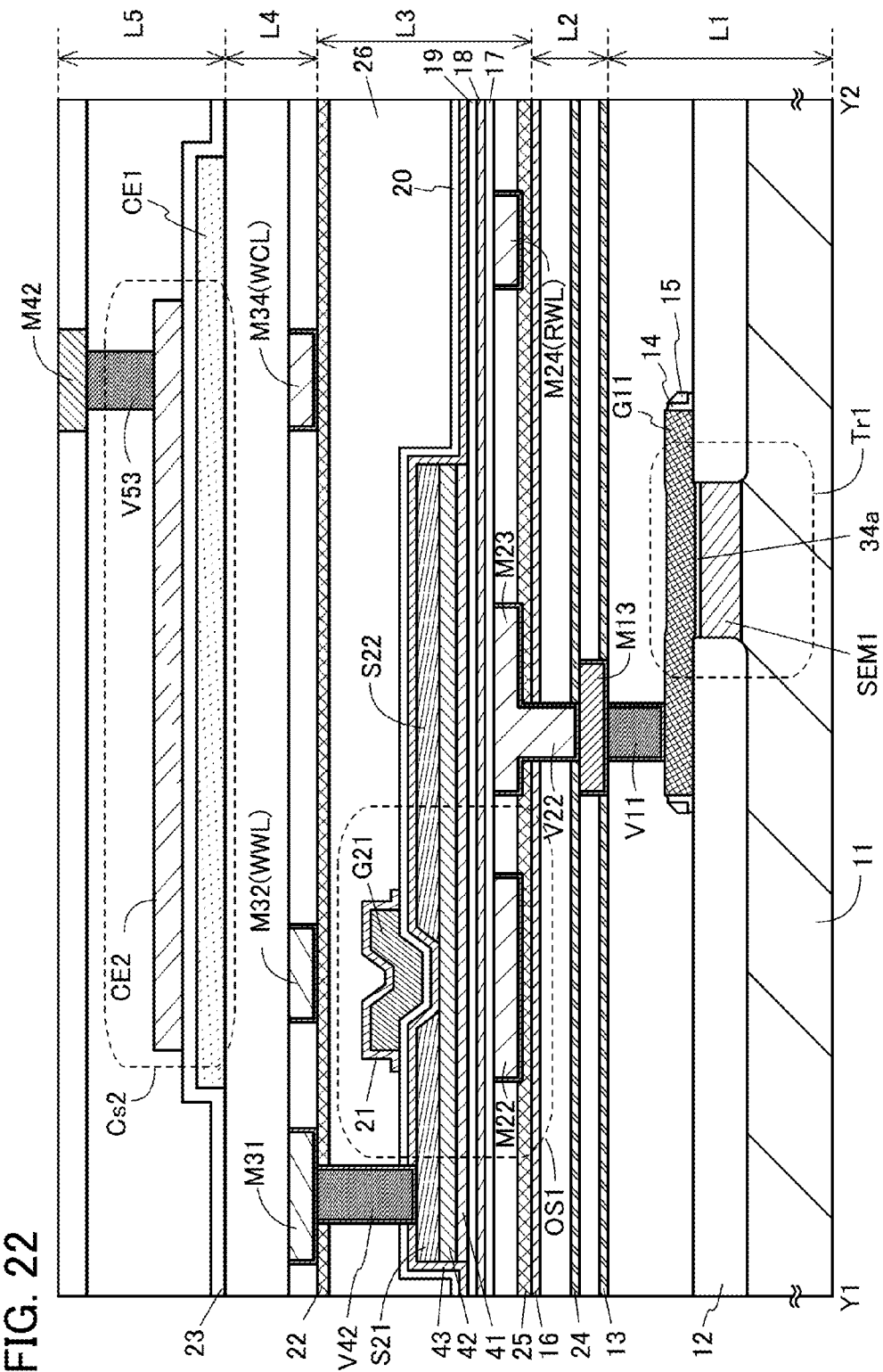
FIG. 22 is a cross-sectional view illustrating a structure example of a memory cell.

The memory cell 10a described in Embodiment 1 and memory cells illustrated in FIG. 21 and FIG. 22 were compared.

The memory cell illustrated in FIG. 21 has a structure excluding the layer L5 that includes the capacitor Cs2 from the memory cell 10a illustrated in FIG. 6. The memory cell 10a uses the capacitors Cs1 and Cs2 as the storage capacitor, while the memory cell illustrated in FIG. 21 uses only the capacitor Cs1 as the storage capacitor.

The memory cell illustrated in FIG. 22 has a structure eliminating the conductor G22 and thereby excluding the capacitor Cs1 from the memory cell 10a illustrated in FIG. 6. The memory cell 10a uses the capacitors Cs1 and Cs2 as the storage capacitor, while the memory cell illustrated in FIG. 22 uses only the capacitor Cs2 as the storage capacitor.

Figure 23:
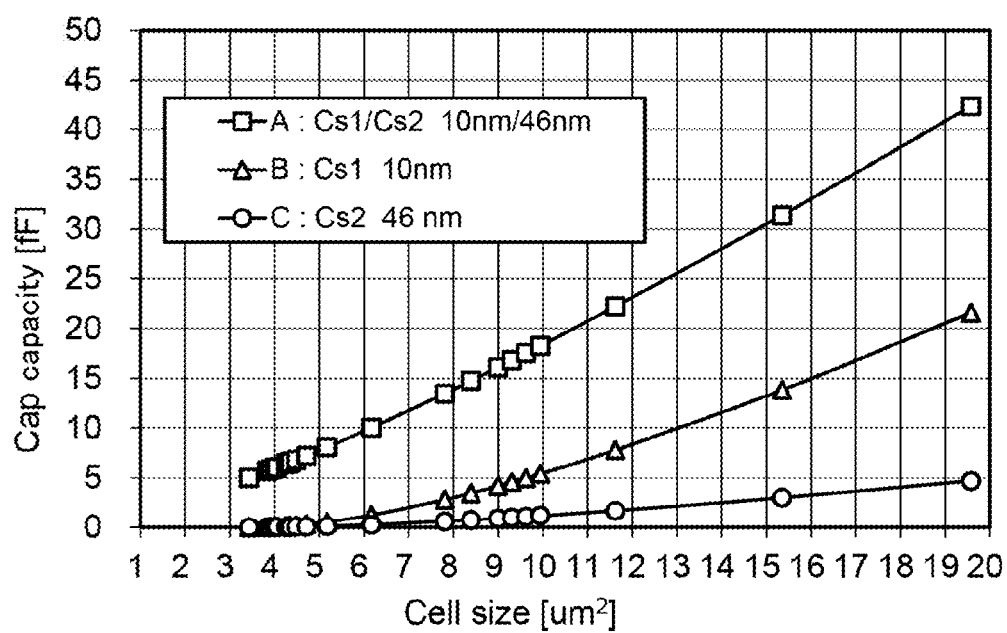
FIG. 23 is a graph showing memory cell area dependence of storage capacity.

The relation between the area of the memory cell (cell size) and the storage capacity of the memory cell (Cap capacity) is shown in FIG. 23. The data indicated by "A" represents the data of the memory cell 10a illustrated in FIG. 6, the data indicated by "B" represents the data of the memory cell illustrated in FIG. 21, and the data indicated by "C" represents the data of the memory cell illustrated in FIG. 22. The thickness of the dielectric (the insulator 20) of the capacitor Cs1 was assumed to be 10 nm, and the thickness of the dielectric (the insulator 23) of the capacitor Cs2 was assumed to be 46 nm. Furthermore, the dielectrics of the capacitors Cs1 and Cs2 were both assumed to be silicon oxide having a relative dielectric constant of 3.9.

The cell size in FIG. 23 is the product of lx and ly in FIG. 3A. The thickness of wirings and the area of plugs were assumed to be constant.

The calculation results in FIG. 23 show that the storage capacity of A (Cs1/Cs2) is larger than that of B (Cs1) or that of C (Cs2). The difference among A, B, and C tends to be reduced as the cell size becomes smaller; however, the storage capacity of A (Cs1/Cs2) is still larger than that of B (Cs1) or that of C (Cs2) at cell sizes of 3.5 μm² or more.

Next, the retention time was calculated from the storage capacity in FIG. 23. The calculation results are shown in FIG. 24.

Figure 24:
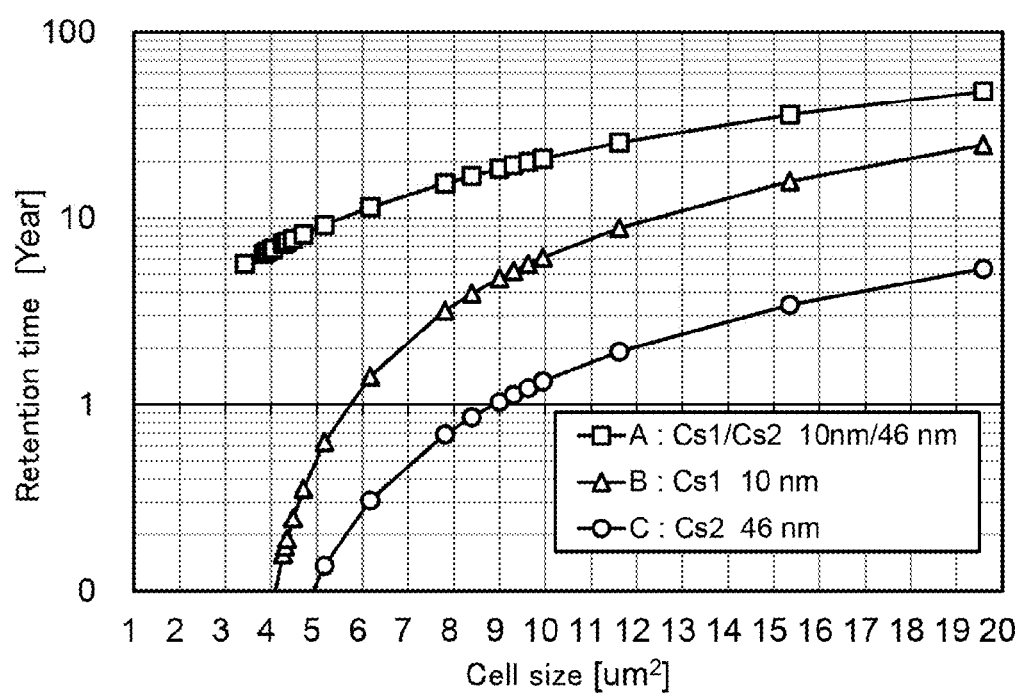
FIG. 24 is a graph showing memory cell area dependence of retention time.

The retention time shown in FIG. 24 was obtained using the following equations (1) and (2).

$$\text{Retention time} = \Delta Q/(I_{OFF} \cdot W) \quad (1)$$

$$\Delta Q = C \cdot V \quad (2)$$

In the equation (1), W represents the channel width of the transistor OS1 and was assumed to be 0.15 μm. In addition, $I_{OFF}$ represents an off-state current through the transistor OS1 with a channel width of 1 μm at a measurement temperature of 85° C. and was assumed to be $93 \times 10^{-24}$ A/μm. In the equation (2), the Cap capacity in FIG. 23 was substituted for C, and V was an application voltage and assumed to be 0.5 V.

It was found from the calculation results in FIG. 24 that the retention time of A (Cs1/Cs2) was longer than that of B (Cs1) or that of C (Cs2) at cell sizes of 3.5 μm² or more.

The above results confirmed that a memory device using the memory cell 10a described in Embodiment 1 can retain data for a long time.

This application is based on Japanese Patent Application serial no. 2016-092865 filed with Japan Patent Office on May 4, 2016, the entire contents of which are hereby incorporated by reference.

What is claimed is:

1. A memory device comprising:
a first transistor;
a second transistor;
a first capacitor;
a second capacitor;
a conductor; and
a first wiring,
wherein the conductor has a function of one of a source and a drain of the first transistor,
wherein the conductor has a function of a first electrode of the first capacitor,
wherein a second electrode of the first capacitor is electrically connected to the first wiring,
wherein a first electrode of the second capacitor is electrically connected to the conductor, wherein a second electrode of the second capacitor is electrically connected to the first wiring,
wherein a gate of the second transistor is electrically connected to the conductor,
wherein the first transistor comprises an oxide semiconductor in a channel formation region,
wherein the second transistor comprises silicon in a channel formation region, and
wherein a region of the second capacitor and a region of the first capacitor overlap with each other.

2. The memory device according to claim 1,
wherein a thickness of a dielectric of the second capacitor is larger than a thickness of a dielectric of the first capacitor.

3. The memory device according to claim 1, further comprising:
a second wiring; and
a third wiring,
wherein the first transistor comprises a first gate and a second gate,
wherein the second wiring is electrically connected to the first gate, and
wherein the third wiring is electrically connected to the second gate.

4. The memory device according to claim 1,
wherein the second transistor is a p-channel transistor.

5. The memory device according to claim 1,
wherein the oxide semiconductor comprises indium, an element M, and zinc, and
wherein the element M is aluminum, gallium, yttrium, tin, boron, silicon, titanium, iron, nickel, germanium, zirconium, molybdenum, lanthanum, cerium, neodymium, hafnium, tantalum, tungsten, and magnesium.

6. A semiconductor wafer comprising:
a plurality of the memory devices according to claim 1; and
a separation region.

7. An electronic device comprising:
the memory device according to claim 1; and
a battery.

8. A memory device comprising:
a first transistor;
a second transistor;
a third transistor;
a first capacitor;
a second capacitor;
a conductor;
a first wiring;
a second wiring; and
a third wiring,
wherein the conductor has a function of one of a source and a drain of the first transistor,
wherein the conductor has a function of a first electrode of the first capacitor,
wherein a second electrode of the first capacitor is electrically connected to the first wiring,
wherein a first electrode of the second capacitor is electrically connected to the conductor,
wherein a second electrode of the second capacitor is electrically connected to the first wiring,
wherein a gate of the second transistor is electrically connected to the conductor,
wherein one of a source and a drain of the second transistor is electrically connected to the second wiring through the third transistor,
wherein the other of the source and the drain of the second transistor is electrically connected to the third wiring,
wherein the first transistor comprises an oxide semiconductor in a channel formation region,
wherein the second transistor comprises silicon in a channel formation region,
wherein the third transistor comprises silicon in a channel formation region, and
wherein a region of the second capacitor and a region of the first capacitor overlap with each other.

9. The memory device according to claim 8,
wherein a thickness of a dielectric of the second capacitor is larger than a thickness of a dielectric of the first capacitor.

10. The memory device according to claim 8, further comprising:
a fourth wiring; and
a fifth wiring,
wherein the first transistor comprises a first gate and a second gate,
wherein the fourth wiring is electrically connected to the first gate, and
wherein the fifth wiring is electrically connected to the second gate.

11. The memory device according to claim 8,
wherein the second transistor is a p-channel transistor.

12. The memory device according to claim 8,
wherein the third transistor is a p-channel transistor.

13. The memory device according to claim 11,
wherein the third transistor is a p-channel transistor.

14. The memory device according to claim 8,
wherein the oxide semiconductor comprises indium, an element M, and zinc, and
wherein the element M is aluminum, gallium, yttrium, tin, boron, silicon, titanium, iron, nickel, germanium, zirconium, molybdenum, lanthanum, cerium, neodymium, hafnium, tantalum, tungsten, and magnesium.

15. A semiconductor wafer comprising:
a plurality of the memory devices according to claim 8; and
a separation region.

16. An electronic device comprising:
the memory device according to claim 8; and
a battery.

* * * * *